(12) United States Patent
Nigam et al.

(10) Patent No.: US 10,269,444 B2
(45) Date of Patent: Apr. 23, 2019

(54) MEMORY WITH BIT LINE SHORT CIRCUIT DETECTION AND MASKING OF GROUPS OF BAD BIT LINES

(71) Applicant: SanDisk Technologies LLC, Plano, TX (US)

(72) Inventors: Anurag Nigam, San Jose, CA (US); Yukeun Sim, Santa Clara, CA (US); Jingwen Ouyang, Mountain View, CA (US); Yingchang Chen, Cupertino, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/491,691

(22) Filed: Apr. 19, 2017

(65) Prior Publication Data

US 2018/0174668 A1    Jun. 21, 2018

Related U.S. Application Data

(60) Provisional application No. 62/437,370, filed on Dec. 21, 2016.

(51) Int. Cl.
    *G11C 29/38*    (2006.01)
    *G11C 7/10*    (2006.01)
    (Continued)

(52) U.S. Cl.
    CPC ............ *G11C 29/38* (2013.01); *G11C 7/1009* (2013.01); *G11C 13/004* (2013.01);
    (Continued)

(58) Field of Classification Search
    CPC ..... G11C 29/78; G11C 11/418; G11C 11/419; G11C 29/38; G11C 29/025; G11C 29/026; G11C 29/44; G11C 29/76; G11C 29/789; G11C 29/804; G11C 29/81; G11C 29/82; G11C 7/1009; G11C 13/0026; G11C 13/0033; G11C 13/004; G11C 2213/71;
    (Continued)

(56) References Cited

U.S. PATENT DOCUMENTS 6,058,052 A * 5/2000 Steadman ............ G11C 29/846
                                                        365/200
6,191,984 B1 * 2/2001 Noh ........................ G11C 29/24
                                                        365/200

(Continued)

*Primary Examiner* — Sung Il Cho
(74) *Attorney, Agent, or Firm* — Vierra Magen Marcus LLP

(57) ABSTRACT

Techniques and memory devices are provided in which bit line short circuits are detected and groups of bit lines are masked off. A process tests groups of bit lines which are connected to a sense circuit. A masking latch is provided to store test results for each group of bit lines. Once the testing of a group is completed, the test result is communicated to a controller. Moreover, the same masking latch can store and communicate test results for multiple groups of bit lines which are connected to a sense circuit. In a user mode, a masking latch stores masking data for each group of bit lines. In response to a power on reset, the masking data is loaded into the masking latches and remains there over multiple write and read operation, until a next power on reset occurs.

12 Claims, 20 Drawing Sheets

(51) Int. Cl.
*G11C 13/00* (2006.01)
*G11C 29/02* (2006.01)
*G11C 29/44* (2006.01)
*G11C 29/00* (2006.01)
*G11C 29/12* (2006.01)

(52) U.S. Cl.
CPC ...... *G11C 13/0026* (2013.01); *G11C 13/0033* (2013.01); *G11C 29/025* (2013.01); *G11C 29/026* (2013.01); *G11C 29/44* (2013.01); *G11C 29/76* (2013.01); *G11C 29/789* (2013.01); *G11C 29/804* (2013.01); *G11C 29/81* (2013.01); *G11C 29/82* (2013.01); *G11C 2029/1204* (2013.01); *G11C 2029/1208* (2013.01); *G11C 2029/4402* (2013.01); *G11C 2213/71* (2013.01)

(58) Field of Classification Search
CPC .... G11C 2029/1204; G11C 2029/1208; G11C 2029/4402
See application file for complete search history.

(56) References Cited

U.S. PATENT DOCUMENTS

| | | | | |
|---|---|---|---|---|
| 6,310,805 B1* | 10/2001 | Kasa | .................. | G11C 29/846 365/196 |
| 6,388,927 B1 | 5/2002 | Churchill et al. | | |
| 6,781,902 B2 | 8/2004 | Oumiya et al. | | |
| 6,868,022 B2 | 3/2005 | Scheuerlein et al. | | |
| 6,999,364 B2 | 2/2006 | Hosokawa et al. | | |
| 7,492,648 B2 | 2/2009 | Sturm et al. | | |
| 8,208,309 B2 | 6/2012 | Fujimura | | |
| 8,885,425 B2 | 11/2014 | Takagiwa | | |
| 9,224,466 B1 | 12/2015 | Chen et al. | | |
| 9,348,694 B1* | 5/2016 | Nassie | ................ | G06F 11/1068 |
| 9,443,612 B2 | 9/2016 | Sbade et al. | | |
| 9,484,114 B1 | 11/2016 | Ben-Rubi et al. | | |
| 2002/0167849 A1* | 11/2002 | Ohbayashi | ............ | G11C 29/50 365/189.09 |
| 2003/0053348 A1* | 3/2003 | Marotta | ................... | G11C 7/18 365/200 |
| 2003/0202417 A1* | 10/2003 | Lee | ..................... | G11C 29/789 365/230.03 |
| 2004/0027880 A1* | 2/2004 | Tanishima | ............ | G11C 29/24 365/200 |
| 2007/0019457 A1* | 1/2007 | Sato | ....................... | G11C 7/02 365/63 |
| 2007/0047355 A1 | 3/2007 | Benzinger et al. | | |
| 2007/0220935 A1* | 9/2007 | Cernea | ................. | G11C 29/846 70/370 |
| 2008/0212370 A1* | 9/2008 | Tokiwa | .................. | G11C 16/06 365/185.09 |
| 2009/0067269 A1 | 3/2009 | Wissel | | |
| 2010/0074028 A1* | 3/2010 | Hirose | .................. | G11C 5/145 365/185.29 |
| 2010/0302866 A1 | 12/2010 | Cha et al. | | |
| 2011/0134707 A1* | 6/2011 | Kim | ..................... | G11C 29/785 365/189.05 |
| 2012/0113724 A1* | 5/2012 | Sako | ................. | G11C 16/0483 365/185.22 |
| 2013/0314992 A1* | 11/2013 | Takagiwa | ............. | G11C 29/04 365/185.09 |
| 2014/0219023 A1* | 8/2014 | Li | ........................ | G11C 29/808 365/185.09 |
| 2014/0347912 A1* | 11/2014 | Siau | ...................... | G11C 7/062 365/148 |
| 2014/0380117 A1* | 12/2014 | Hirano | .................. | G11C 29/78 714/758 |
| 2015/0063013 A1* | 3/2015 | Iizuka | ................. | G11C 29/702 365/158 |
| 2015/0287480 A1* | 10/2015 | Wilson | .................. | G11C 29/70 365/96 |
| 2016/0232969 A1 | 8/2016 | Balakrishnan et al. | | |
| 2016/0276023 A1 | 9/2016 | Chen et al. | | |
| 2016/0351498 A1* | 12/2016 | Chang | .................. | G11C 17/143 |
| 2017/0228189 A1* | 8/2017 | Sudo | .................... | G11C 7/1006 |
| 2017/0345485 A1* | 11/2017 | Sinangil | .................. | G11C 11/419 |

* cited by examiner

| Remapping table | |
|---|---|
| Bad group | Redundant group |
| Add_630R | 634L |
| ... | |

| Masking data | |
|---|---|
| Group address | Bit |
| Add_630L | 1 |
| Add_630R | 0 |
| Add_631L | 1 |
| Add_631R | 1 |
| Add_632L | 1 |
| Add_632R | 1 |
| Add_633L | 1 |
| Add_633R | 1 |
| Add_634L | 1 |
| Add_634R | 1 |

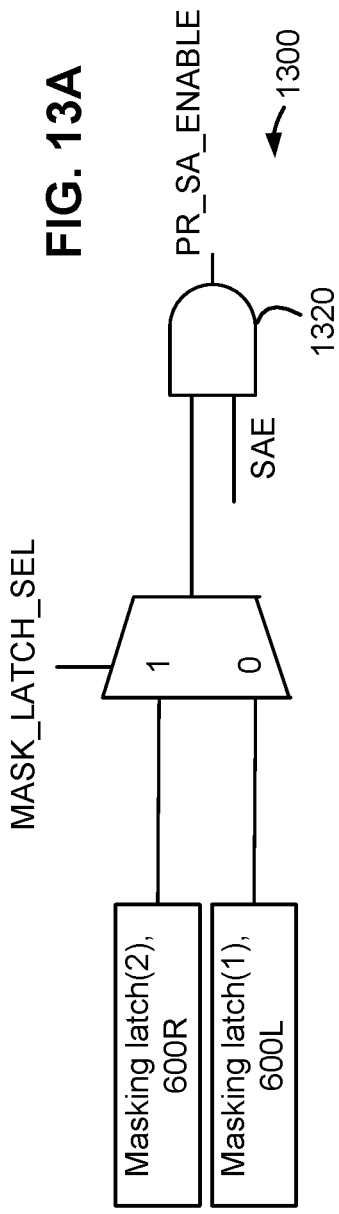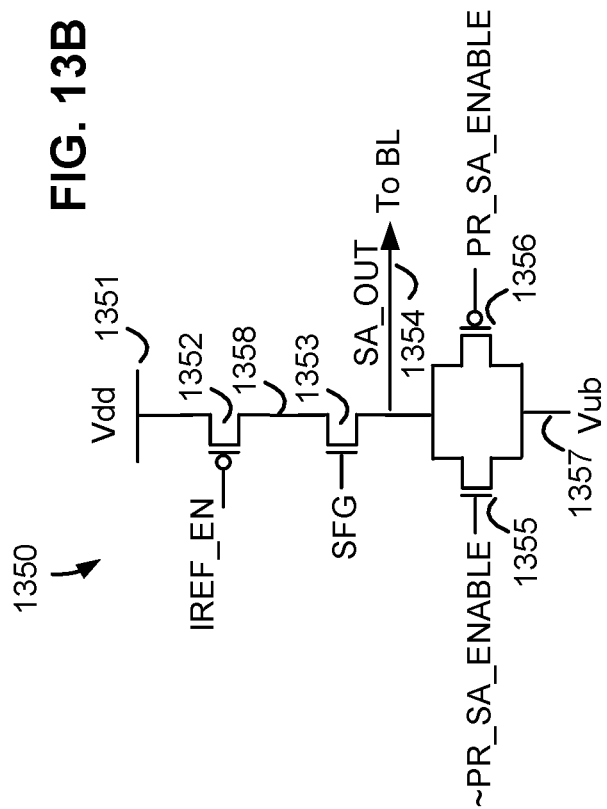

US 10,269,444 B2

MEMORY WITH BIT LINE SHORT CIRCUIT DETECTION AND MASKING OF GROUPS OF BAD BIT LINES

PRIORITY CLAIM

This application claims the benefit of U.S. provisional pat. app. 62/437,370, filed Dec. 21, 2016.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics over process, voltage, and temperature variations and increased leakage currents through unselected memory cells.

BRIEF DESCRIPTION OF THE DRAWINGS

FIG. 1A depicts one embodiment of a memory system 101 and a host 106.

FIG. 1B depicts one embodiment of memory core control circuits 104.

FIG. 1C depicts one embodiment of memory core 103 in FIG. 1A.

FIG. 1D depicts one embodiment of memory bay 330 in FIG. 1C.

FIG. 1E depicts one embodiment of memory block 310 in FIG. 1D.

FIG. 1F depicts one embodiment of a memory bay 332.

FIG. 1G depicts one embodiment of a schematic diagram (including word lines and bit lines) corresponding with memory bay 332 in FIG. 1F.

FIG. 13A depicts an example circuit for enabling or disabling a group of bit lines based on the latches of FIGS. 11A and 11B.

FIG. 13B depicts an example circuit for supplying a voltage to a bit line, consistent with FIG. 13A.

DETAILED DESCRIPTION

Figure 1A:
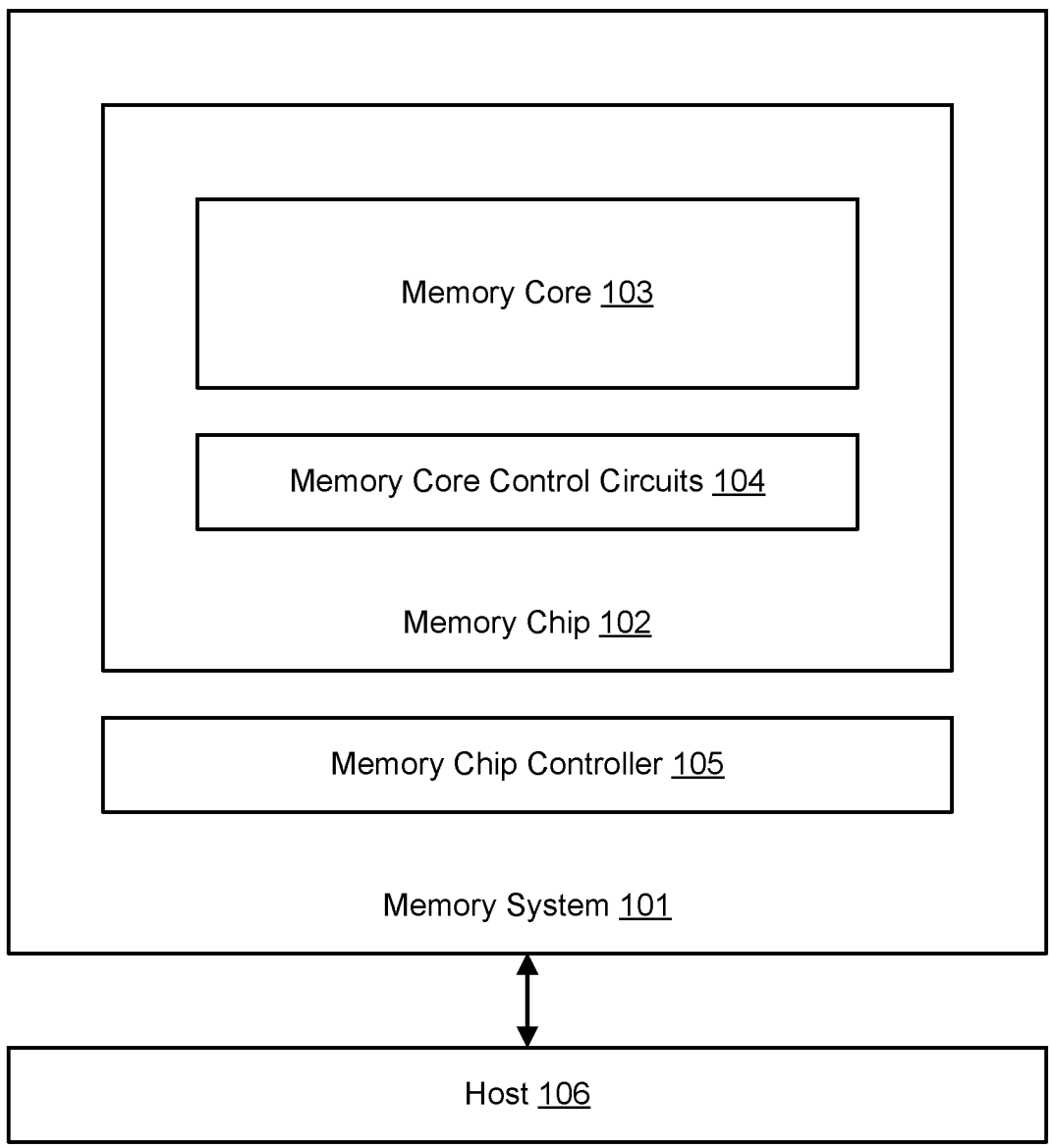
FIG. 1A-1G depict various embodiments of a memory system.

Techniques and memory devices are provided in which bit line short circuits are detected and groups of bit lines are masked off.

Resistive random access memory (RAM) has emerged as potential candidate for Storage Class Memory applications. However, resistive RAM technology has many challenges in process development. For example, bit line short circuits which are typically bit line-to-bit line short circuits is one such challenge. Due to variations in the fabrication process, for instance, an electrical path may be formed between bit lines which prevents them from being used to access the associated memory cells. These short circuits can be detected during the die sort process, before the memory device is provided to the end user. However, testing all of the bit lines and reporting the test results to the memory device controller can be time consuming.

Moreover, during the user mode operations, the bad bit lines should be masked off to avoid a large leakage current and potential damage to the device. In one possible approach, a two-step process is performed during each write operation. A first step involves transferring data regarding the bad bit lines to a page register for loading into latches to mask off bad bit lines. These are latches which store error count information indicating whether there is a mismatch in the user data and the memory data. During a write operation, these latches are initialized with the masking data, indicating whether a certain bit line should be read/written or not. However, these latches are reset before every read or write operation, since they might have the error count information of the previous operation. The latches have to be reloaded with the masking data during every write operation. This is data which is separate from the user data of a write operation, for instance. Such data is communicated with write data to the latches by a controller to indicate whether one or more group of bit lines is to be enabled or disabled during the write operation.

A second step involves the controller sending user write data to another set of latches. This process is time consuming due to the two separate steps.

Techniques provided herein address the above and other issues. In one approach, a bit line testing process tests groups of bit lines which are connected to a sense circuit. A masking latch is provided to store test results for each group of bit lines. Once the testing of a group is completed, the test result is communicated to a controller. The test result can be a single bit, for example. Moreover, the same masking latch can store and communicate test results in turn for multiple groups of bit lines which are connected to a sense circuit. The time used to communicate test results to the controller is therefore reduced.

In another approach, a memory device is provided in which a masking latch stores masking data for each group of bit lines. The masking data is stored in a non-volatile column redundancy circuit on the chip, where the memory cell array is also on the chip. In response to a power on reset of the memory device, the masking data is communicated to a page register and loaded into the masking latches. The masking data remains in the masking latches over multiple write and read operation, until a next power on reset occurs. As a result, the masking data does not have to be loaded with each read or write operation. Moreover, the additional circuitry for providing the masking latches is minimal, as a single masking latch can be used for each group of bit lines. With two groups of bit lines per sense circuit for example, two masking latches are provided.

These and other advantages are discussed further below.

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

The memory chip controller 105 may be an off-the-chip controller which provides read and write commands to the chip without providing data for enabling or disabling groups of bit lines, as discussed herein.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
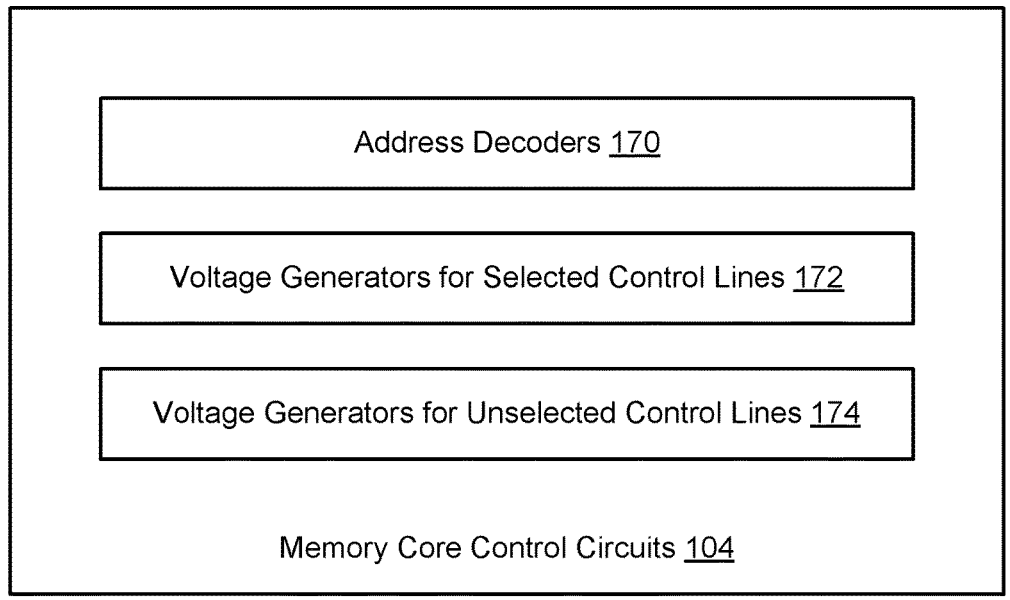

FIG. 1B depicts one embodiment of memory core control circuits 104. As depicted, the memory core control circuits 104 include address decoders 170, voltage generators 172 for selected control lines, and voltage generators 174 for unselected control lines. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIG. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
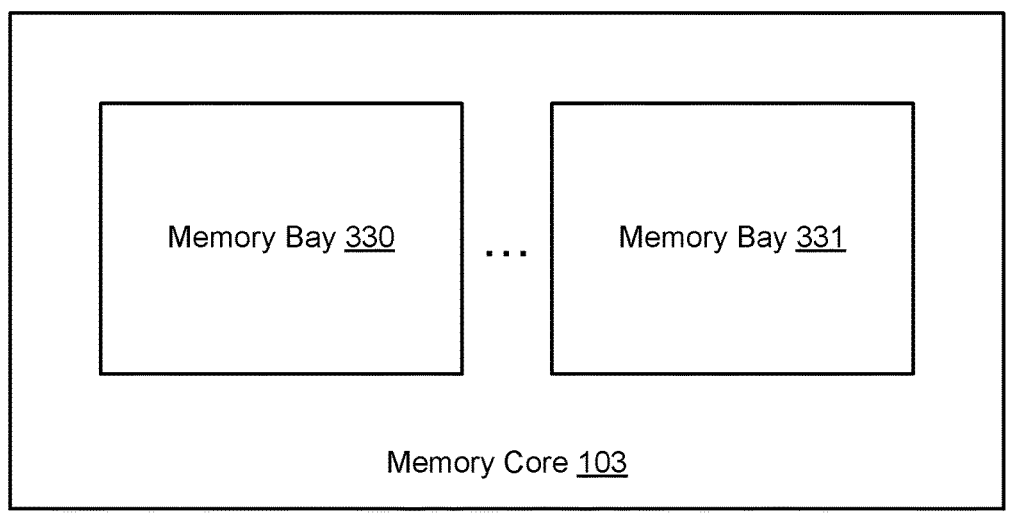

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays or 256 memory bays).

Figure 1D:
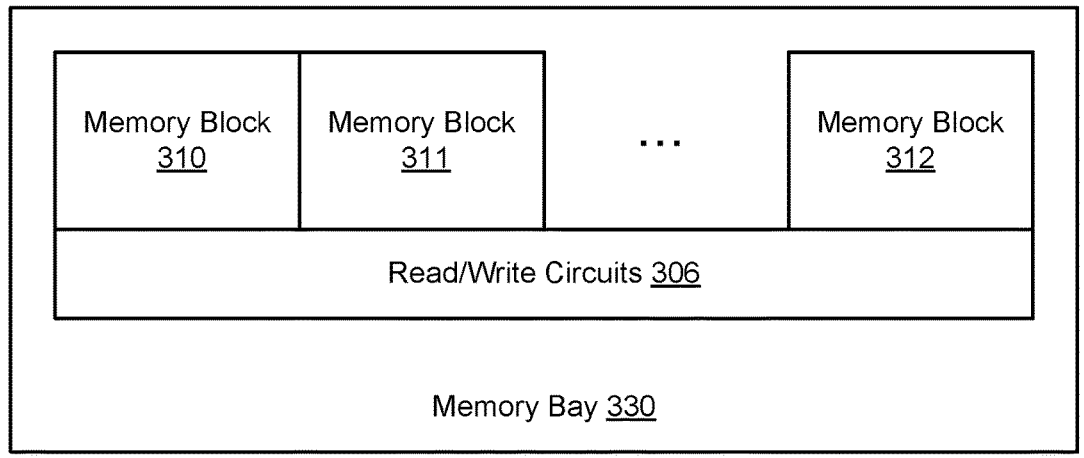

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5 V). The particular memory cell may be reset to the "0" state by applying a second voltage difference across the particular memory cell of a second polarity that is opposite to that of the first polarity (e.g., −1.5 V).

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2 V) across the particular memory cell to program the particular memory cell into a first state of the three or more data/resistance states or a second voltage difference (e.g., 1 V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
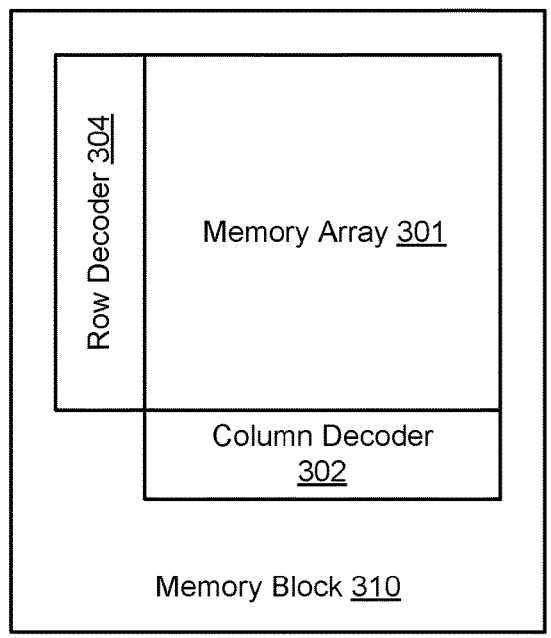

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory block 310 or array may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
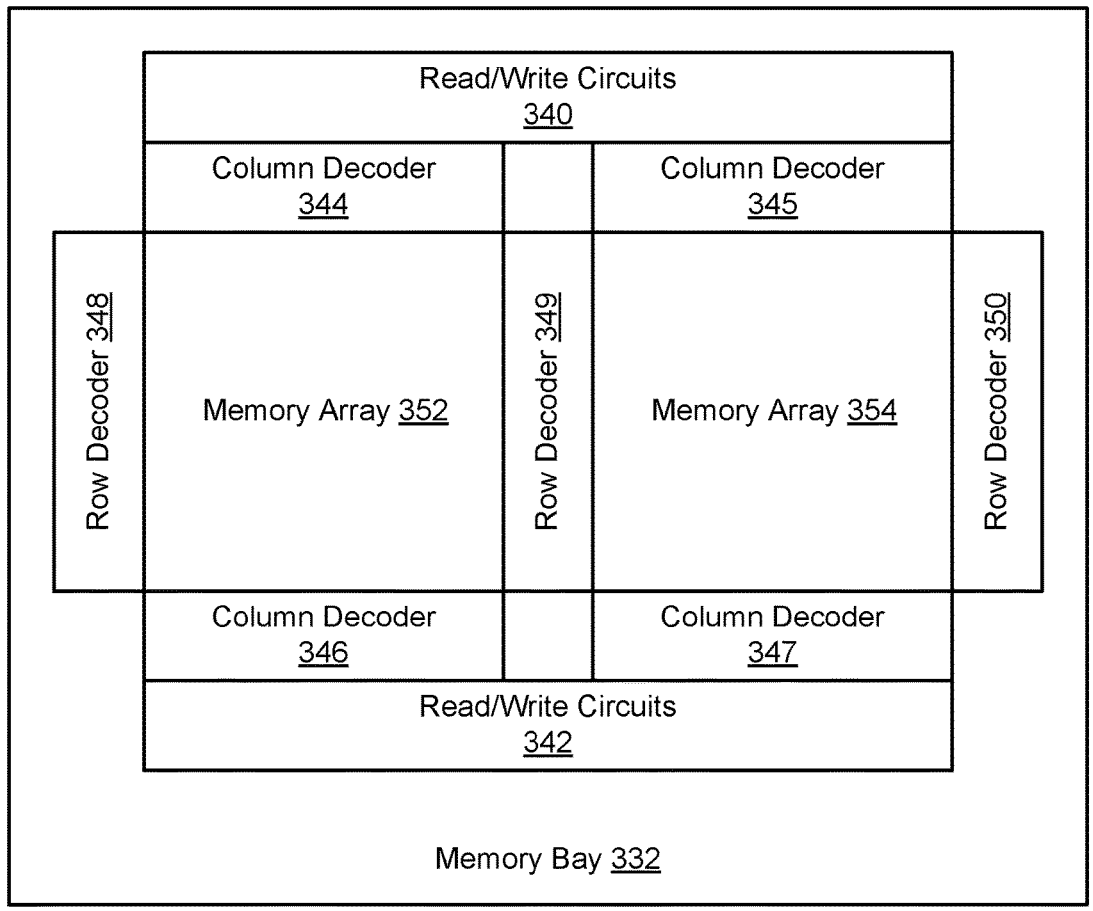

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349.

Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Similarly, column decoders 345 and 347 may be split. Splitting the read/write circuits into read/write circuits 340 and 342 when the column decoders are split may allow for a more efficient layout of the memory bay.

Figure 1G:
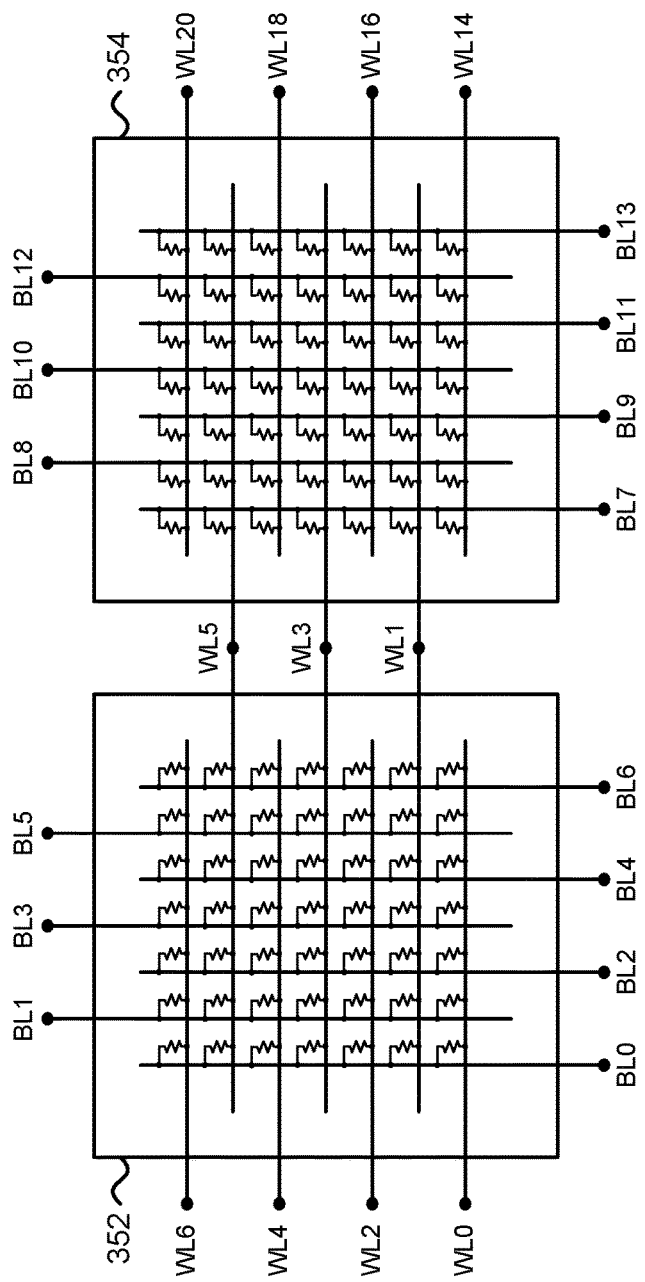

FIG. 1G depicts one embodiment of a schematic diagram (including word lines and bit lines) corresponding with memory bay 332 in FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, WL18, and WL20 are driven from the right side of memory array 354 and controlled by row decoder 350 of FIG. 1F. Bit lines BL0, BL2, BL4, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical with respect to the supporting substrate (i.e., the vertical plane is perpendicular to the supporting substrate). In this case, the bit lines of the memory arrays may comprise vertical bit lines.

Figure 2A:
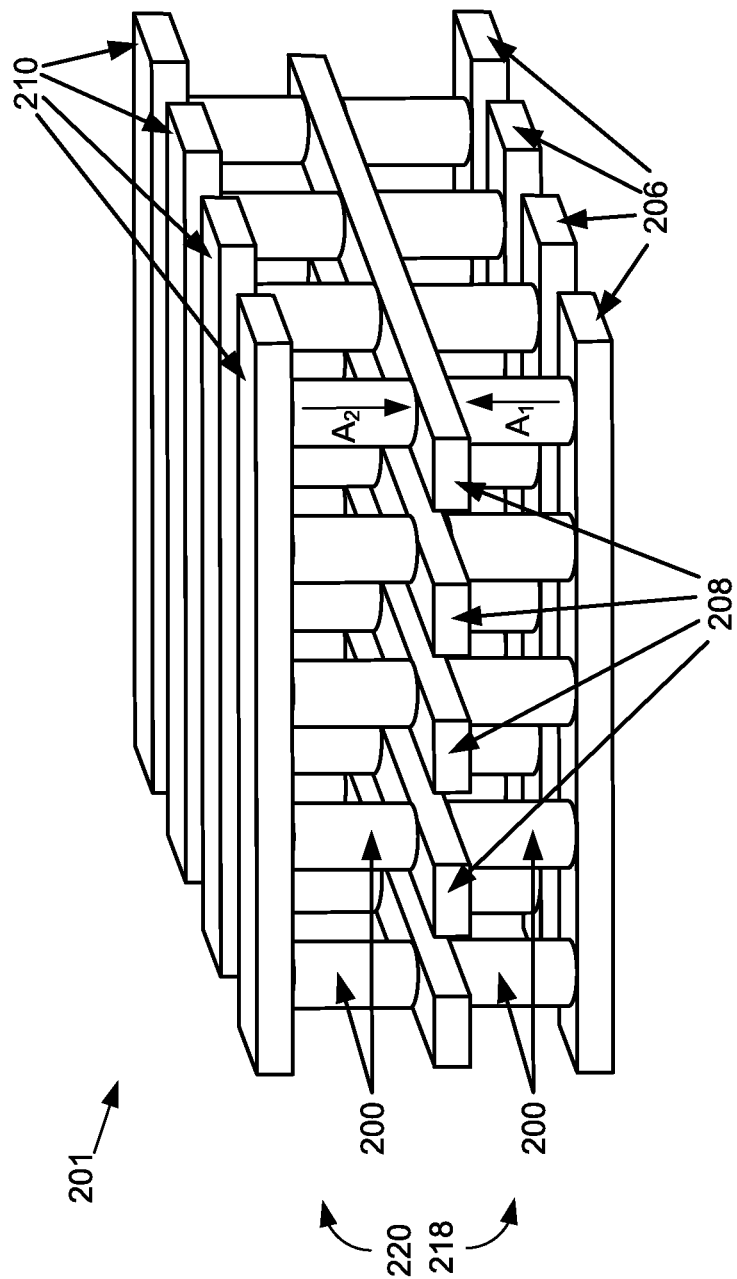
FIG. 2A depicts one embodiment of a portion of a monolithic three-dimensional memory array 201 that includes a second memory level 220 positioned above a first memory level 218.

FIG. 2A depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow A1 (e.g., with p regions at the bottom of the diodes), while the diodes of the second memory level 220 may be downward pointing diodes as indicated by arrow A2 (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 200 of FIG. 2A may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a barrier layer comprising germanium or silicon germanium and a metal oxide (e.g., a binary metal oxide). The metal oxide may include titanium oxide, nickel oxide, or hafnium oxide. In some cases, the re-writeable non-volatile memory cells may comprise resistive RAM (Re-RAM) devices.

Referring to FIG. 2A, in one embodiment of a read operation, the data stored in one of the plurality of memory cells 200 may be read by biasing one of the word lines (i.e., the selected word line) to a selected word line voltage in read mode (e.g., 0 V). A read circuit may then be used to bias a selected bit line connected to the selected memory cell to the selected bit line voltage in read mode (e.g., 1.0 V). In some cases, in order to avoid sensing leakage current from the many unselected word lines to the selected bit line, the unselected word lines may be biased to the same voltage as the selected bit lines (e.g., 1.0 V). To avoid leakage current from the selected word line to the unselected bit lines, the unselected bit lines may be biased to the same voltage as the selected word line (e.g., 0 V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 2A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

Referring to FIG. 2A, in one embodiment of a write operation, data may be written to one of the plurality of memory cells 200 by biasing one of the word lines (i.e., the selected word line) to the selected word line voltage in write mode (e.g., 5 V). A write circuit may be used to bias the bit line connected to the selected memory cell to the selected bit line voltage in write mode (e.g., 0 V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 2B:
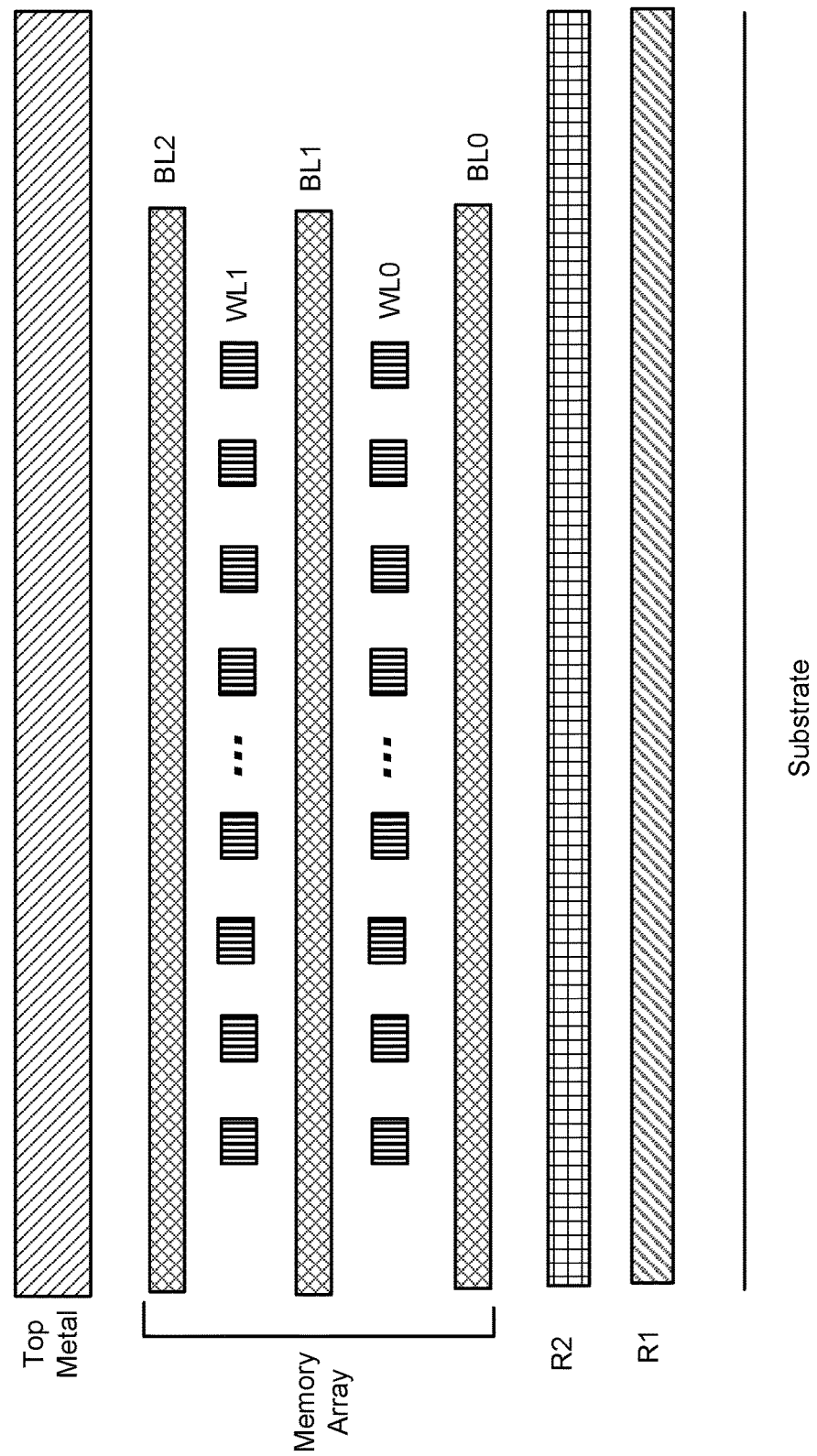
FIG. 2B depicts a subset of the memory array and routing layers of one embodiment of a three-dimensional memory array, such as memory array 301 in FIG. 1E.

FIG. 2B depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 2B, two metal layers R1 and R2 may be used for routing layers; however, other embodiments can include more or less than two metal layers. In one example, these metal layers R1 and R2 may be formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3A:
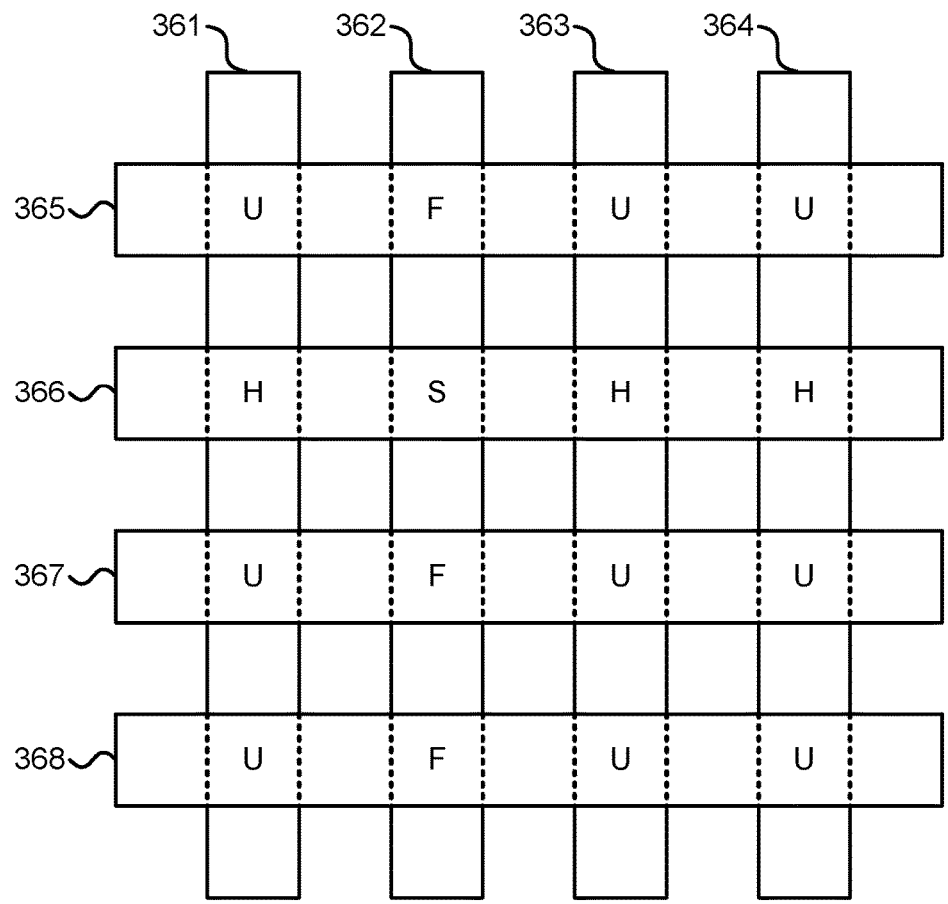
FIG. 3A depicts one embodiment of a cross-point memory array 360.

FIG. 3A depicts one embodiment of a cross-point memory array 360. In one example, the cross-point memory array 360 may correspond with memory array 201 in FIG. 2A. As depicted, cross-point memory array 360 includes word lines 365-368 and bit lines 361-364. The bit lines 361 may comprise vertical bit lines or horizontal bit lines. Word line 366 comprises a selected word line and bit line 362 comprises a selected bit line. At the intersection of selected word line 366 and selected bit line 362 is a selected memory cell (an S cell). The voltage across the S cell is the difference between the selected word line voltage and the selected bit line voltage. Memory cells at the intersections of the selected word line 366 and the unselected bit lines 361, 363, and 364 comprise unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 362 and the unselected word lines 365, 367, and 368 comprise unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 365, 367, and 368 and the unselected bit lines 361, 363, and 364 comprise unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

Figure 3B:
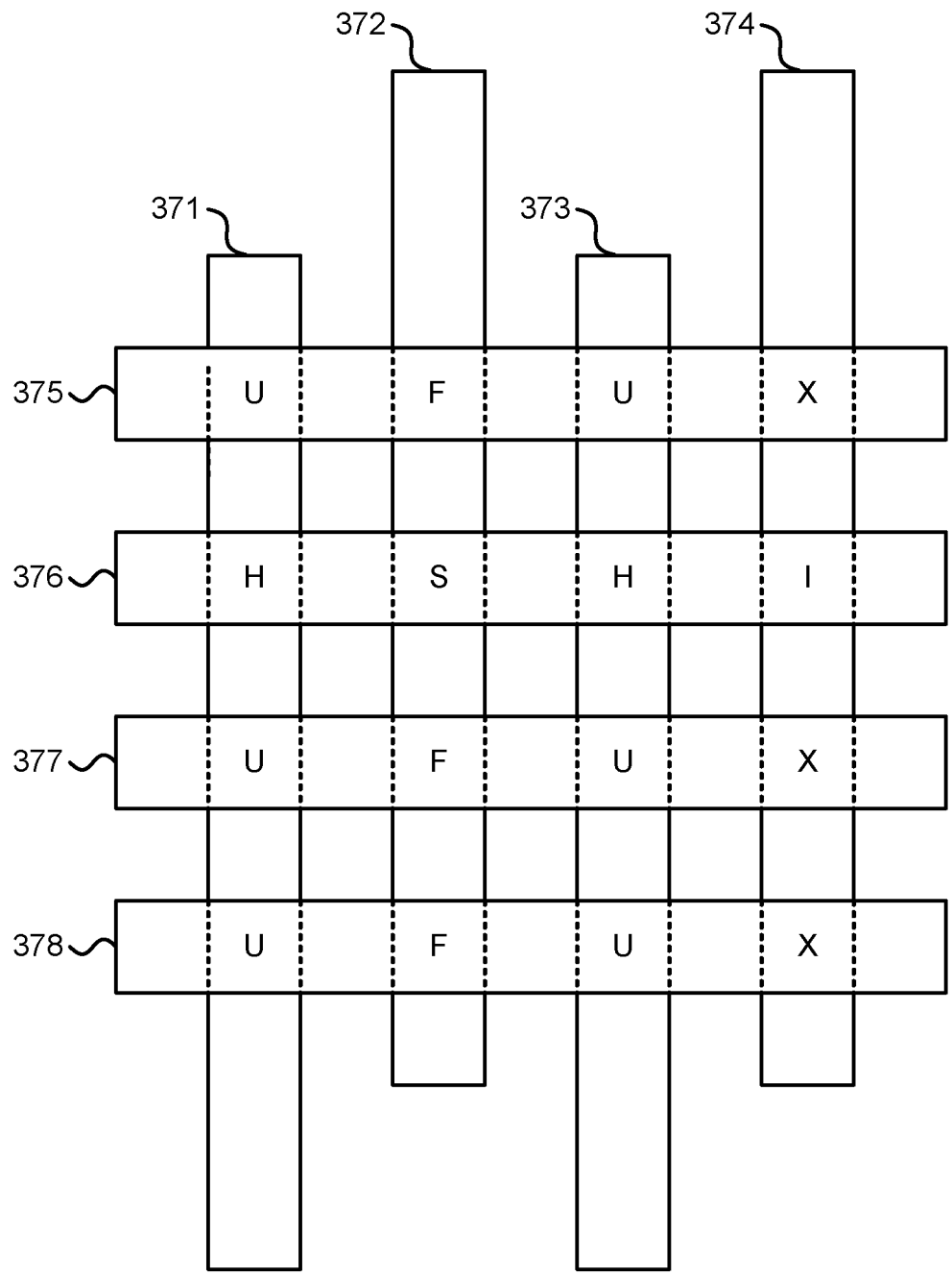
FIG. 3B depicts an alternative embodiment of a cross-point memory array 370.

FIG. 3B depicts an alternative embodiment of a cross-point memory array 370. In one example, the cross-point memory array 370 may correspond with memory array 201 in FIG. 2A. As depicted, cross-point memory array 370 includes word lines 375-378 and bit lines 371-374. The bit lines 361 may comprise vertical bit lines or horizontal bit lines. Word line 376 comprises a selected word line and bit lines 372 and 374 comprise selected bit lines. Although both bit lines 372 and 374 are selected, the voltages applied to bit line 372 and bit line 374 may be different. For example, in the case that bit line 372 is associated with a first memory cell to be programmed (i.e., an S cell), then bit line 372 may be biased to a selected bit line voltage in order to program the first memory cell. In the case that bit line 374 is associated with a second memory cell that is not to be programmed (i.e., an I cell), then bit line 374 may be biased to a program inhibit voltage (i.e., to a bit line voltage that will prevent the second memory cell from being programmed).

At the intersection of selected word line 376 and selected bit line 374 is a program inhibited memory cell (an I cell). The voltage across the I cell is the difference between the selected word line voltage and the program inhibit voltage.

Memory cells at the intersections of the selected bit line 374 and the unselected word lines 375, 377, and 378 comprise unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 374 may be the same as or substantially the same as the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 375 may be associated with a first page and a second page. The first page may correspond with bit lines 371 and 373 and the second page may correspond with bit lines 372 and 374. In this case, the first page and the second page may correspond with interdigitated memory cells that share the same word line. When a memory array operation is being performed on the first page (e.g., a programming operation) and the selected word line 376 is biased to the selected word line voltage, one or more other pages also associated with the selected word line 376 may comprise H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 370 may comprise resistive memory elements without isolating diodes. In one embodiment, the bit lines 372 and 373 may comprise vertical bit lines in a three dimensional memory array comprising comb shaped word lines.

Figure 4A:
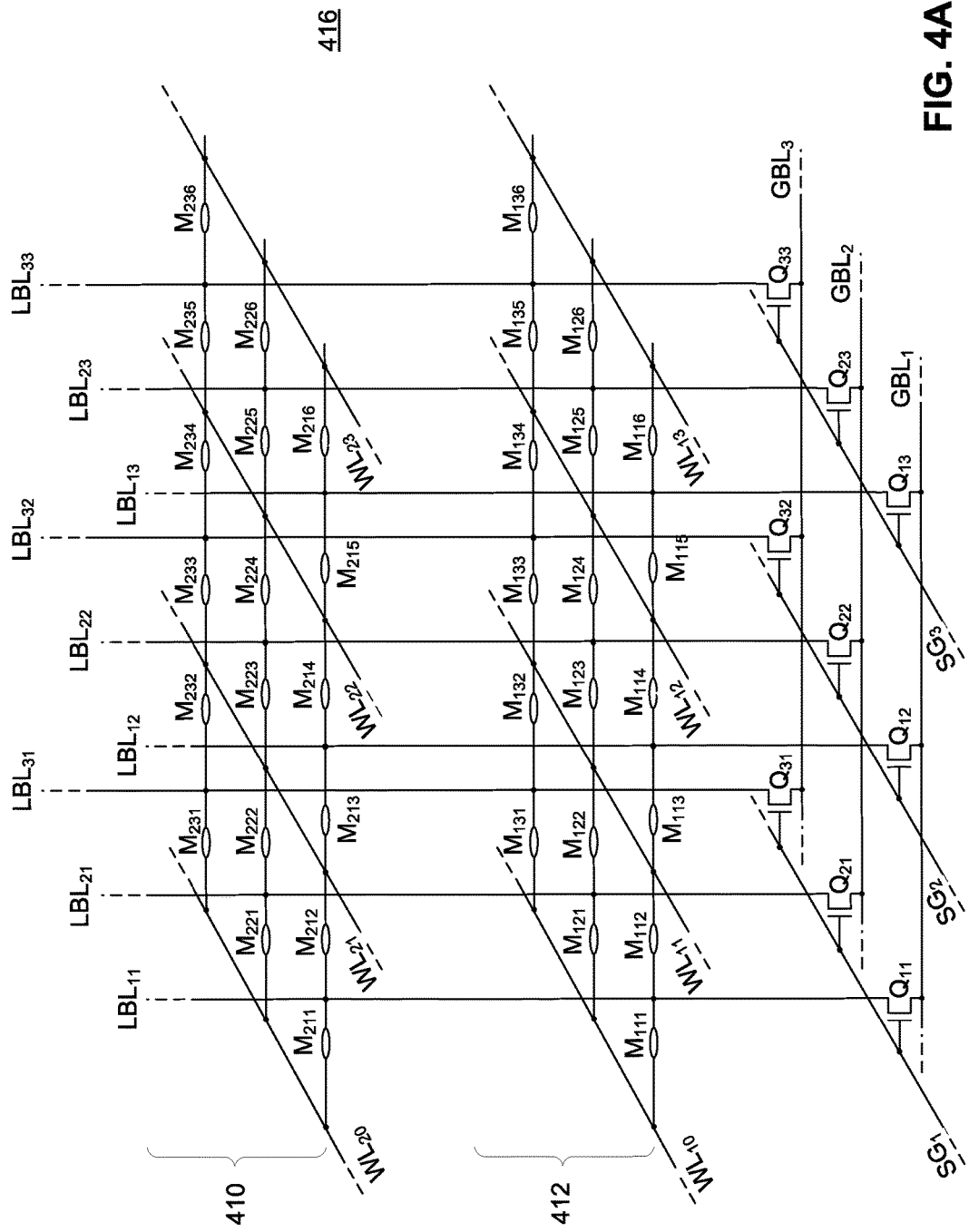
FIG. 4A depicts one embodiment of a portion of a monolithic three-dimensional memory array 416 that includes a first memory level 412 positioned below a second memory level 410.

FIG. 4A depicts one embodiment of a portion of a monolithic three-dimensional memory array 416 that includes a first memory level 412 positioned below a second memory level 410. Memory array 416 is one example of an implementation for memory array 301 in FIG. 1E. As depicted, the local bit lines LBL11-LBL33 are arranged in a first direction (i.e., a vertical direction) and the word lines WL10-WL23 are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell M111 is disposed between local bit line LBL11 and word line WL10). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines GBL1-GBL3 are arranged in a third direction that is perpendicular to both the first direction and the second direction. A set of bit line select devices (e.g., Q11-Q31) may be used to select a set of local bit lines (e.g., LBL11-LBL31). As depicted, bit line select devices Q11-Q31 are used to select the local bit lines LBL11-LBL31 and to connect the local bit lines LBL11-LBL31 to the global bit lines GBL1-GBL3 using row select line SG1. Similarly, bit line select devices Q12-Q32 are used to selectively connect the local bit lines LBL12-LBL32 to the global bit lines GBL1-GBL3 using row select line SG2 and bit line select devices Q13-Q33 are used to selectively connect the local bit lines LBL13-LBL33 to the global bit lines GBL1-GBL3 using row select line SG3.

Referring to FIG. 4A, as only a single bit line select device is used per local bit line, only the voltage of a particular global bit line may be applied to a corresponding local bit line. Therefore, when a first set of local bit lines (e.g., LBL11-LBL31) is biased to the global bit lines GBL1-GBL3, the other local bit lines (e.g., LBL12-LBL32 and LBL13-LBL33) must either also be driven to the same global bit lines GBL1-GBL3 or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines LBL11-LBL31 are biased to one or more selected bit line voltages via the global bit lines GBL1-GBL3, while the other local bit lines (e.g., LBL12-LBL32 and LBL13-LBL33) are floated. The one or more selected bit line voltages may correspond with, for example, one or more read voltages during a read operation or one or more programming voltages during a programming operation.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 4B:
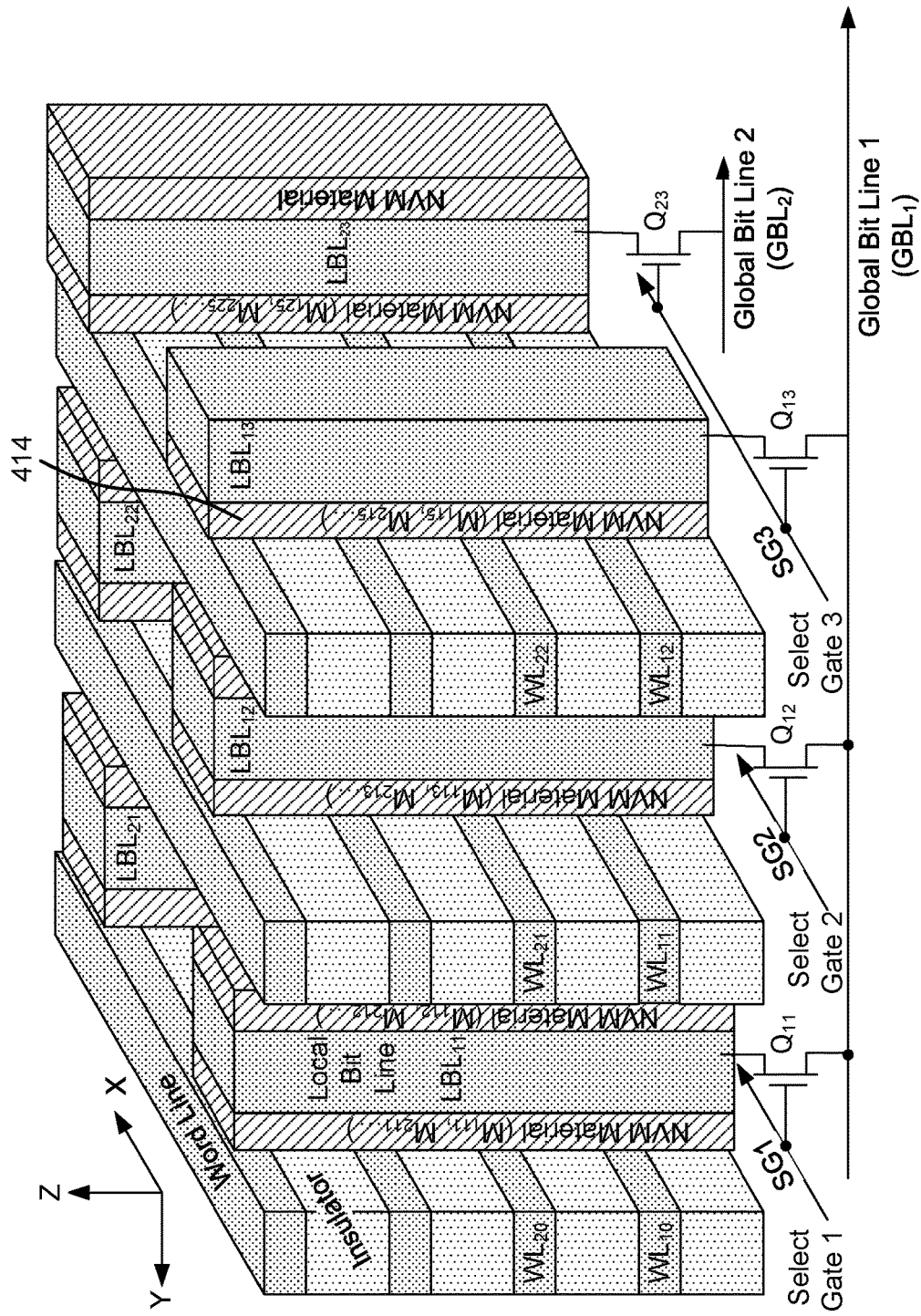
FIG. 4B depicts one embodiment of a portion of a monolithic three-dimensional memory array that includes vertical strips of a non-volatile memory material.

FIG. 4B depicts one embodiment of a portion of a monolithic three-dimensional memory array that includes vertical strips of a non-volatile memory material. The physical structure depicted in FIG. 4B may comprise one implementation for a portion of the monolithic three-dimensional memory array depicted in FIG. 4A. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., titanium oxide, nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 414 may comprise a part of a first memory cell associated with the cross section between WL12 and LBL13 and a part of a second memory cell associated with the cross section between WL22 and LBL13. In some cases, a vertical bit line, such as LBL13, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an nMOS device) or a vertical thin-film transistor (TFT).

Figure 5:
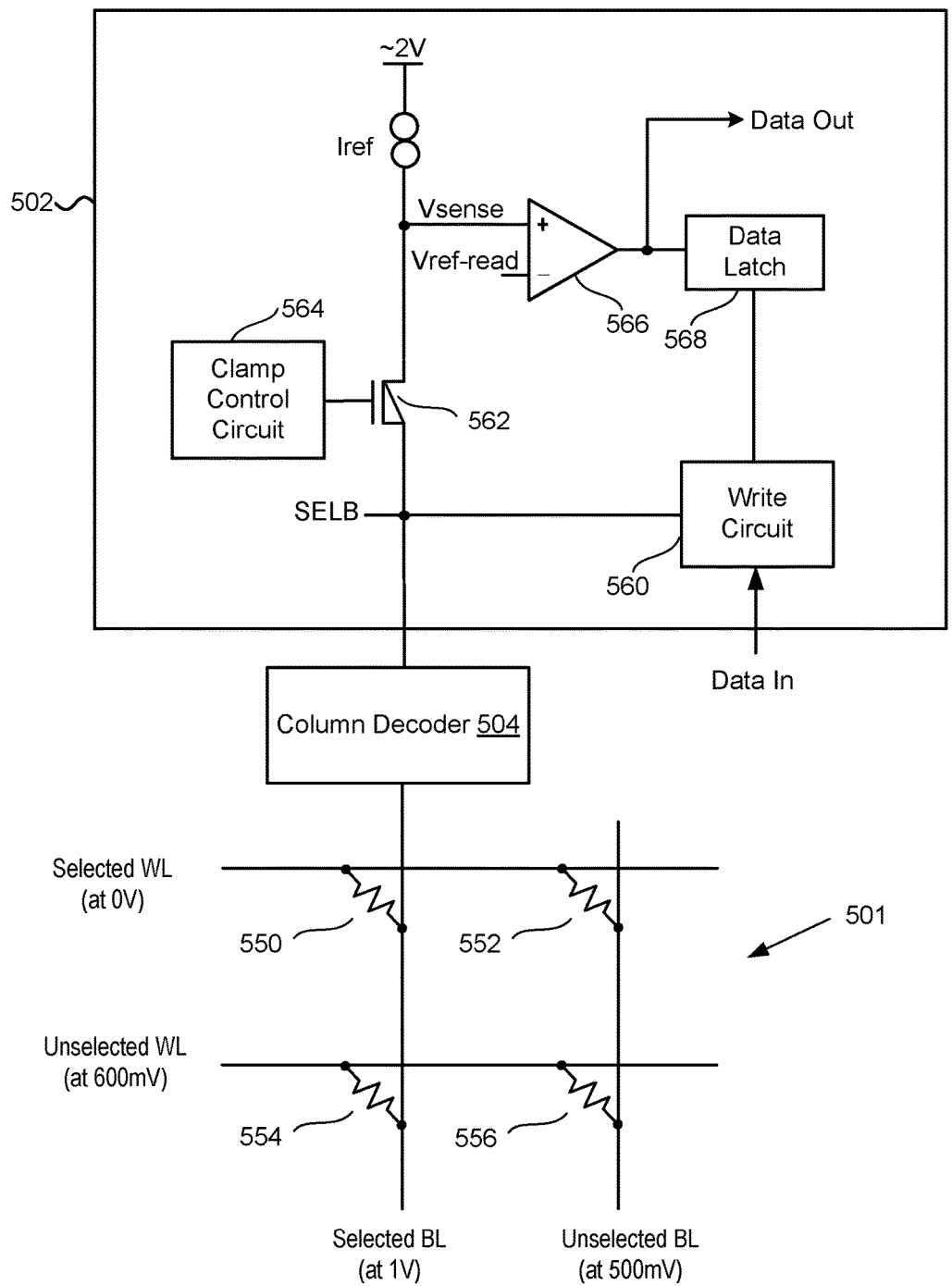
FIG. 5 depicts one embodiment of a read/write circuit.

FIG. 5 depicts one embodiment of a read/write circuit 502 along with a portion of a memory array 501. Read/write circuit 502 is one example of an implementation of the read/write circuit 306 in FIG. 1D. It is also an example of the sense circuits SC0-SC4 of FIG. 6. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2A. In another embodiment, the portion of a memory array 501 may comprise a memory array with bit lines arranged in a vertical direction that is perpendicular to the substrate, such as memory array 416 in FIG. 4A.

As depicted, during a memory array operation (e.g., a programming operation), the selected bit line may be biased to 1 V, the unselected word line may be biased to 0.6 V, the selected word line may be biased to 0 V, and the unselected bit line may be biased to 0.5 V. In some embodiments, during a second memory array operation, the selected bit line may be biased to a selected bit line voltage (e.g., 2.0 V), the unselected word line may be biased to an unselected word line voltage (e.g., 1.0 V), the selected word line may be biased to a selected word line voltage (e.g., 0 V), and the unselected bit line may be biased to an unselected bit line voltage (e.g., 1 V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0 V, the unselected word line is biased to 0.4 V, the selected word line is biased to 1 V, and the unselected bit line is biased to 0.5 V.

As depicted in FIG. 5, the SELB node of read/write circuit 502 may be electrically coupled to the selected bit line via column decoder 504. In one embodiment, column decoder 504 may correspond with column decoder 302 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2 V (or some other voltage greater than the selected bit line voltage). When sensing data, read/write circuit 502 attempts to regulate the SELB node to the selected bit line voltage (e.g., 1 V) via clamp control circuit 564 and transistor 562 in a source-follower configuration. If the current through the selected memory cell 550 is greater than the read current limit, Iref, then, over time, the Vsense node will fall below Vref-read (e.g., set to 1.5 V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2 V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0 V or −1.2 V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

Figure 6:
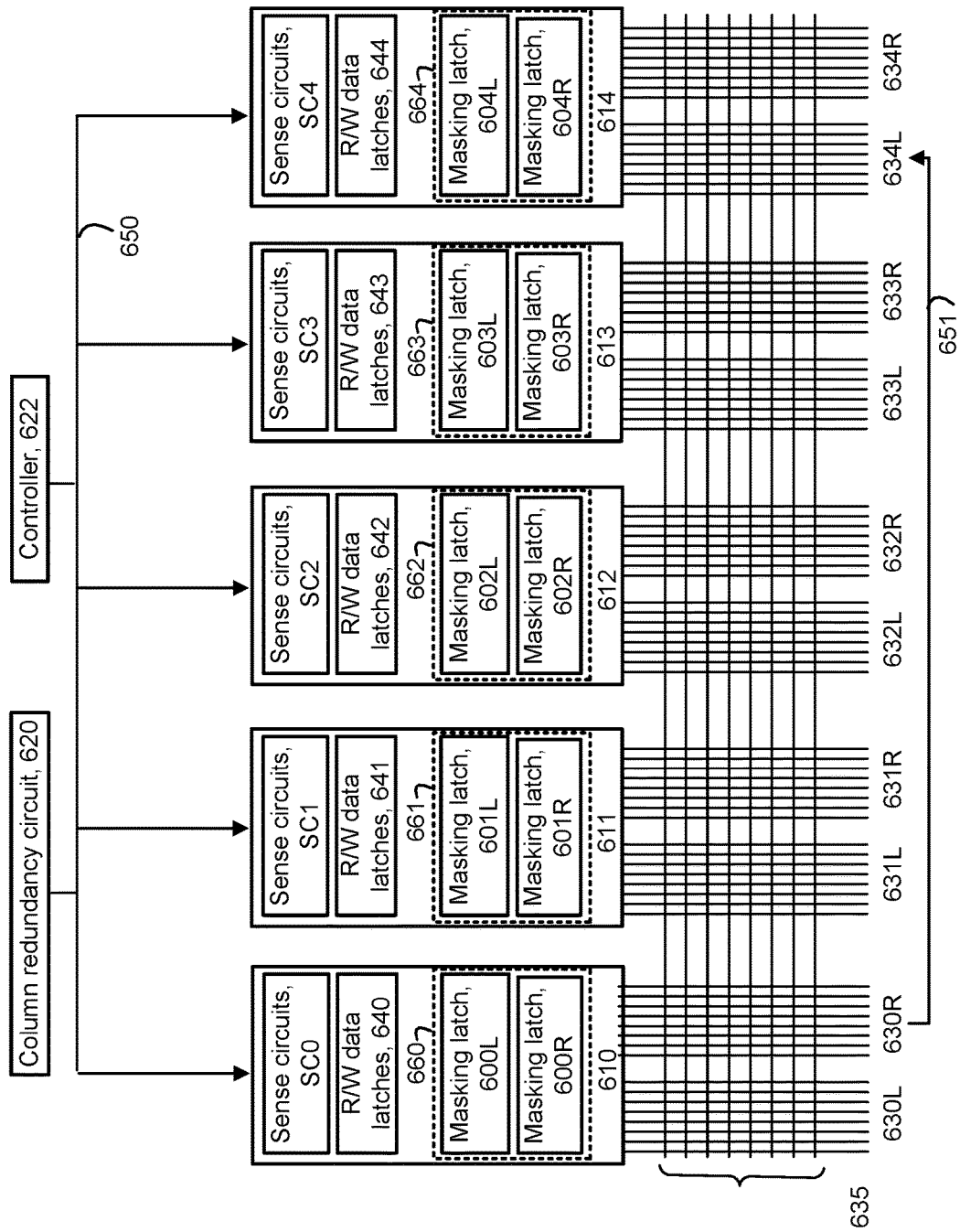
FIG. 6 depicts an example configuration of a memory device with two groups of bit lines per sense circuit.

FIG. 6 depicts an example configuration of a memory device with two groups of bit lines per sense circuit. The device includes a number of circuits 610, 611, 612 and 613 which are associated with a primary (non-redundant) set of bit lines and associated memory cells and a circuit 614 which is associated with a redundant set of bit lines and associated memory cells. The memory cells are located at the intersection of the bit lines and the word lines 635. The redundant set of bit lines and associated memory cells are used in case one of the primary sets of bit lines is found to be bad in a testing process. In practice, many more primary and redundant sets of bit lines and associated memory cells can be used. Each sense circuit is connected to one or more groups of bit lines and the associated memory cells. In some cases, each sense circuit is connected to two groups. It can be convenient to divide the bit lines into such groups such as when the physical layout of the bit lines is different for the two groups. For instances, the bit lines can be arranged in left and right hand intermeshing combs. The groups include left hand, primary groups 630L, 631L, 632L and 633L, left hand, redundant group 634L, right hand, primary groups 630R, 631R, 632R and 633R, and right hand, redundant group 634R.

In other embodiments, there is exactly one group of bit lines per sense circuit.

A sense circuit, e.g., comprising a sense amplifier, is connected to each group of bit lines. The sense circuit may be similar to the read/write circuit of FIG. 5, for example. In this example, each sense circuit is connected to two groups of bit lines. For example, sense circuits SC0, SC1, SC2, SC3 and SC4 are connected to groups 630L and 630R, 631L and 631R, 632L and 632R, 633L and 633R and 634L and 634R, respectively. The sense circuits are used to apply voltages to the bit lines during read and write operations. Each circuit comprises read/write (R/W) data latches which store user data which is written to or read from the associated memory cells. For example, a page of data may be written in which different portions of the page are stored using the different sense amplifiers. In this example, two bytes of data are stored using a sense circuit, assuming one bit per cell. The circuits 610, 611, 612, 613 and 614 comprise R/W data latches 640, 641, 642, 643 and 644, respectively. These are latch circuits. In some cases, a cache may be associated with each set of R/W data latches to allow additional flexibility in transferring data in reading and writing operations.

The circuits 610, 611, 612, 613 and 614 further comprise a masking latch for each group of bit lines. For example, masking latches 600L, 601L, 602L, 603L and 604L store masking data for groups 630L, 631L, 632L, 633L and 634L, and masking latches 600R, 601R, 602R, 603R and 604R store masking data for groups 630R, 631R, 632R, 633R and 634R. In one embodiment, the masking data comprises one bit which indicates whether the associated group of bit lines should be enabled (not masked) or disabled (masked). Advantageously, this approaches minimizes the amount of data which is stored in the latches.

A column redundancy circuit 620 or module stores the masking data for each group of bit lines in non-volatile storage and provides it to page registers 660, 661, 662, 663 and 664 for loading into the masking latches in response to a power on reset of the memory device. The masking latches may be provided as part of the page registers, for example. A power on reset is an event which occurs when power is applied to the memory device. A power on reset circuit may be used to provide the reset. The circuit ensures that the controller 622 receives a predictable, regulated voltage and that it starts in the same, known state every time it is powered up. For example, a power on reset may occur when a user presses a button on a device such as a cell phone or camera which comprises the memory device. Once the masking data is loaded into the masking latches, it remains there until the next power on reset. Thus, the masking data remains through multiple read and/or write operations and is always present to disable bad groups of bit lines. This avoids unnecessary power consumption and potential damage to the memory device which could occur if a voltage is applied to a bad bit line, such as a short circuited bit line.

Figures 7A, 7B, 7C:
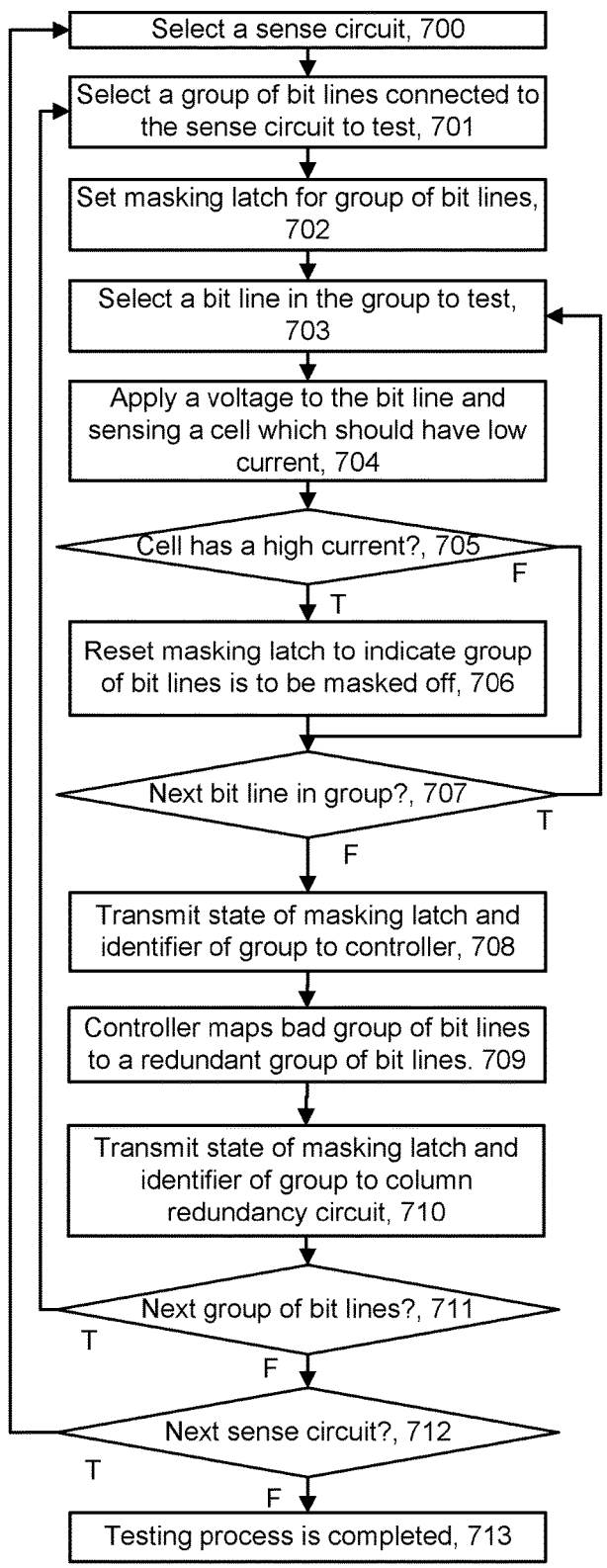
FIG. 7A depicts an example process for testing groups of bit lines.
FIG. 7B depicts an example remapping table in the controller 622 of FIG. 6 which maps an address of a bad group of bit lines to a redundant group of bit line, consistent with the process of FIG. 7A.
FIG. 7C depicts example masking data in the column redundancy circuit 620 of FIG. 6 which identifies good and bad groups of bit lines, consistent with the process of FIG. 7A.

The arrow 651 shows that the primary group 634L is remapped to the redundant group 634L, in an example which is consistent with FIG. 7B.

In one embodiment, each sense circuit is connected to first and second groups of bit lines; the latches comprise latches 600L-604L for the first group of bit lines 630L-634L and latches 600R-604R for the second group of bit lines 630R-634R; the latches for the first group of bit lines comprise masking data, e.g., a bit, to enable or disable the first group of bit lines; and the latches for the second group of bit lines comprise masking data, e.g., a bit, to enable or disable the second group of bit lines. In this case, the first group of bit lines can be independently enabled or disable relative to the second group of bit lines. The bits in the latches are represented by the values BL_SHORT_DATA and ER_MASK_DATA, discussed further below. Circuitry is used to read the bit from each latch and use it to determine whether to enable or disable the corresponding bit line. If the bit has one value, the bit line is enabled. If the bit has another other value, the bit line is disabled. In one approach, the bit in each latch is used to set a value PR_SA_ENABLE which controls whether the bit line is enabled or disabled.

FIG. 7A depicts an example process for testing groups of bit lines. The testing process can be performed at the time of manufacture, for example, before the memory device is provided to the end user. The testing process can determine whether a bit line is short-circuited to another bit line. In one approach, a bit line is tested by reading a memory cell which is connected to it. For example, consider a memory cell having a resistivity-switching material, e.g., a resistance-switching memory cell. As mentioned in connection with FIG. 5, a high or low current is detected by a sense circuit when a memory cell is in a low or high resistance state, respectively. During the testing process, the memory cells can be provided initially in the high resistance (low current) state. The testing process then reads the cells, and if a high current is detected, it is assumed that that there is a short circuit in the bit line which is causing the current to be high. The bit line is considered to be bad and unsuitable for use. The associated group of bit lines is marked as being bad and information regarding the good or bad state of each group of bit lines is transferred from the sense circuits and latches to the controller. This reduces the amount of data transfers and saves time compared to the case where information regarding the good or bad state of each individual bit line is transferred from the sense circuits and latches to the controller. Moreover, the masking out of a group of bit lines can occur in units of one or more bytes, in one approach, for compatibility with reading and writing operations of the controller.

As another example, consider a set of memory cells having a charge-trapping material such as memory cells in NAND strings. The memory cells can be provided in an erased state such that little or no current should be sensed in the memory strings if the bit lines are good. A voltage is applied to the word line which is greater than the threshold voltage of the erased state in the testing process. If a high current is detected, it is concluded that the bit line is bad.

Step 700 includes selecting a sense circuit. Step 701 includes selecting a group of bit lines connected to the sense circuit to test. Step 702 includes setting a masking latch (provide the set-reset latch in the set state) for the selected group of bit lines. For example, see the masking latch 600L of FIG. 9A. The latch may be a set-reset (S/R) latch, for example. Step 703 includes selecting a bit line in the group to test. For example, the first group of bit lines in FIG. 6 may be the group 630L and the first bit line may be BL0L in FIG. 9A. Step 704 includes applying a voltage to the bit line and sensing a cell which should have a low current. A decision step 705 determines if the cell has a high current. If decision step is true, step 706 resets the masking latch (provide the set-reset latch in the reset state) to indicate the group of bit lines is to be masked off In this example, the group of bit lines has a bad or defective bit line.

If decision step 705 is false, or after step 706 is performed, a decision step 707 determines if there is a next bit line in the group to test. If decision step 707 is true, step 703 is repeated by selecting the next bit line. If decision step 707 is false, step 708 transmits the state of the masking latch and an identifier of the group to a controller. This is the reporting of the test result. The state of the masking latch may be a bit of 1 or 0 for good or bad, respectively, or set or reset, respectively. The identifier of the group could be an address, e.g., Add_630R, such as depicted in FIG. 7B. In some case, external test equipment may be used which communicates an identifier of the currently tested group of bit lines to the controller.

The bit is therefore communicated to the controller after the testing is completed without communicating data indicating a per-bit line result of the testing. Further, the bit has one value (e.g., 1) indicating the group of bit lines is good in response to the testing indicating all of the bit lines are good and another value (e.g., 0) indicating the group of bit lines is bad in response to the testing indicating one or more of the bit lines is bad.

At step 709, the controller maps the bad group of bit lines to a redundant group of bit lines. For example, the controller can add the address of the bad group to a remapping table (FIG. 7B) which identifies an address of a redundant group which is to replace the bad group of bit lines. The controller could also maintain a table of good groups of bit lines.

Step 710 transmits the state of the masking latch and an identifier of the group to a column redundancy circuit 620. The column redundancy circuit stores this information and uses it to configure the masking latch when there is a power on reset during the user operations. See also FIG. 8A. A decision step 711 determines if there is a next group of bit lines to test for the current sense circuit. As mentioned, in some cases there are multiple groups per sense circuit. For example, the group 630R can be tested after the group 630L in FIG. 6. If decision step 711 is true, step 701 selects the next group of bit lines. If decision step 711 is false, a decision step 712 determines if there is a next sense circuit whose bit lines are to be tested. If decision step 712 is true, step 700 selects the next sense circuit. For example, SC1 can be tested after SC0 in FIG. 6. If decision step 712 is false, the testing process is completed at step 713.

Note that the redundant groups of bit lines can also be tested. If a redundant group of bit lines is bad, it can be masked out in a similar way as a primary group of bit lines.

FIG. 7B depicts an example remapping table in the controller 622 of FIG. 6 which maps an address of a bad group of bit lines to a redundant group of bit line, consistent with the process of FIG. 7A. For example, the group 630R is bad and has an address Add_630R. The corresponding redundant group is group 634L (FIG. 5) which has an address Add_634L.

FIG. 7C depicts example masking data in the column redundancy circuit 620 of FIG. 6 which identifies good and bad groups of bit lines, consistent with the process of FIG. 7A. The column redundancy circuit may be used to set or reset each of the masking latches (to store a bit in each masking latch) in response to a power on event. In one approach, the column redundancy circuit stores a bit for each group of bit lines which denotes whether masking of the group of bit lines should occur. For example, a 1 denotes a good group which should not be masked and a 0 denotes a bad group which should be masked. In one possible approach, a table is stored which cross-references each group address to a bit which denotes good or bad.

Figure 8A:
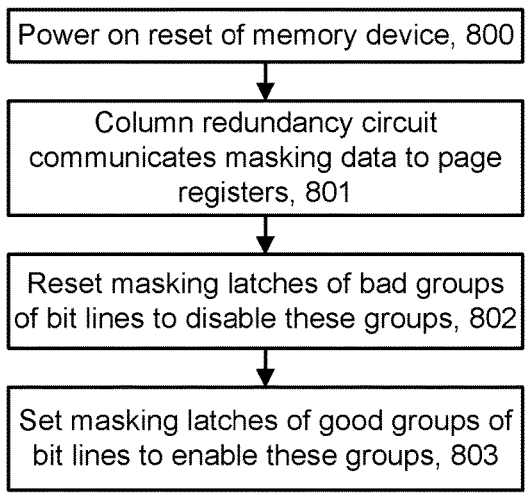
FIG. 8A depicts a process for configuring masking latches in response to a power on reset of a memory device.

FIG. 8A depicts a process for configuring masking latches in response to a power on reset of a memory device. Step 800 includes performing a power on reset of the memory device. In response to this event, at step 801, the column redundancy circuit communicates masking data to page registers 660-664. In one approach, each page register is associated with a sense circuit and the associated bit lines. The column redundancy circuit can provide masking data to each page register which the page register loads into the masking latches to enable or disable the associated groups of bit lines. Specifically, step 802 includes resetting the masking latches of the bad groups of bit lines to disable these groups. That is, the ability of a voltage source such as the voltage generators 172 and 174 of FIG. 1B to provide a voltage on these bit lines is blocked. Step 803 includes setting the masking latches of the good groups of bit lines to enable these groups. The ability of a voltage source such as the voltage generators 172 and 174 of FIG. 1B to provide a voltage on these bit lines which is suitable for reading or writing is not blocked. The disabled bit lines may still receive some voltage such as 0 V (See FIG. 13B) but the voltage is not suitable for reading or writing. The loading of the masking data is performed by setting or resetting the masking latches.

Figure 8B:
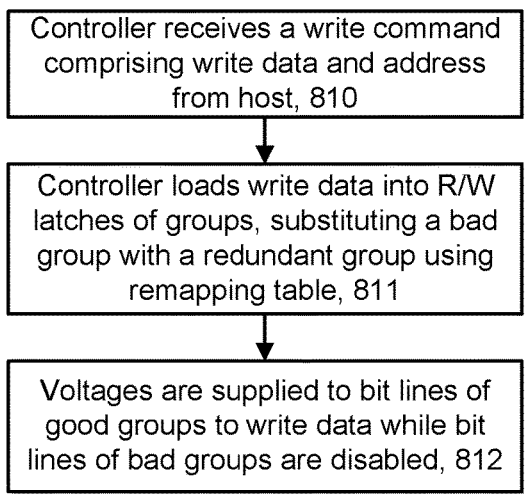
FIG. 8B depicts a process performed by a controller for writing data, where voltages are supplied to good groups of bit lines while bad groups of bit lines are disabled, consistent with the process of FIG. 8A.

FIG. 8B depicts a process performed by a controller for writing data, where voltages are supplied to good groups of bit lines while bad groups of bit lines are disabled, consistent with the process of FIG. 8A. At step 810, the controller receives a write (program) command comprising write data and an address from a host device, for example. In other cases, the controller decides internally, independently of the host device, to read or write data. The address may specify a range of cells which can store the write data. For example, this can be cells of a particular word line. At step 811, the controller loads the write data into R/W latches of the bit line groups, substituting a bad group with a redundant group, e.g., using the remapping table of FIG. 7B. The write data may be loaded in to the R/W latches of successive groups of bit lines until a bad group of bit lines is reached, in one approach. The corresponding unit is then diverted to the R/W latches of the redundant group of bit lines. The next unit is loaded into the R/W latches of the next group of good bit lines. For example, the write data can be loaded in increments of multiple bytes. At step 812, voltages are supplied to the bit lines of the good groups of bit lines (including any redundant groups of bit lines which are being used) to write data into the associated memory cells while the bad groups of bit lines are disabled.

Figure 8C:
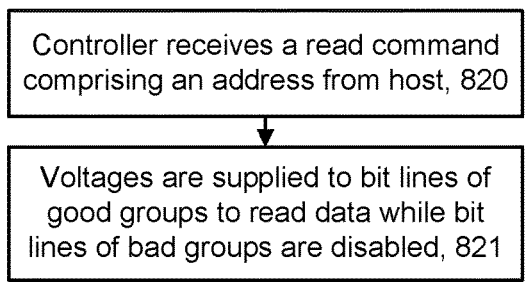
FIG. 8C depicts a process performed by a controller for reading data, where voltages are supplied to good groups of bit lines while bad groups of bit lines are disabled, consistent with the process of FIG. 8A.

FIG. 8C depicts a process performed by a controller for reading data, where voltages are supplied to good groups of bit lines while bad groups of bit lines are disabled, consistent with the process of FIG. 8A. At step 820, the controller receives a read command comprising an address from a host device, for example. The address may specify a range of cells which is to be read. At step 821, voltages are supplied to the bit lines of the good groups of bit lines (including any redundant groups of bit lines which are being used) to read data from the associated memory cells while the bad groups of bit lines are disabled.

Figure 9A:
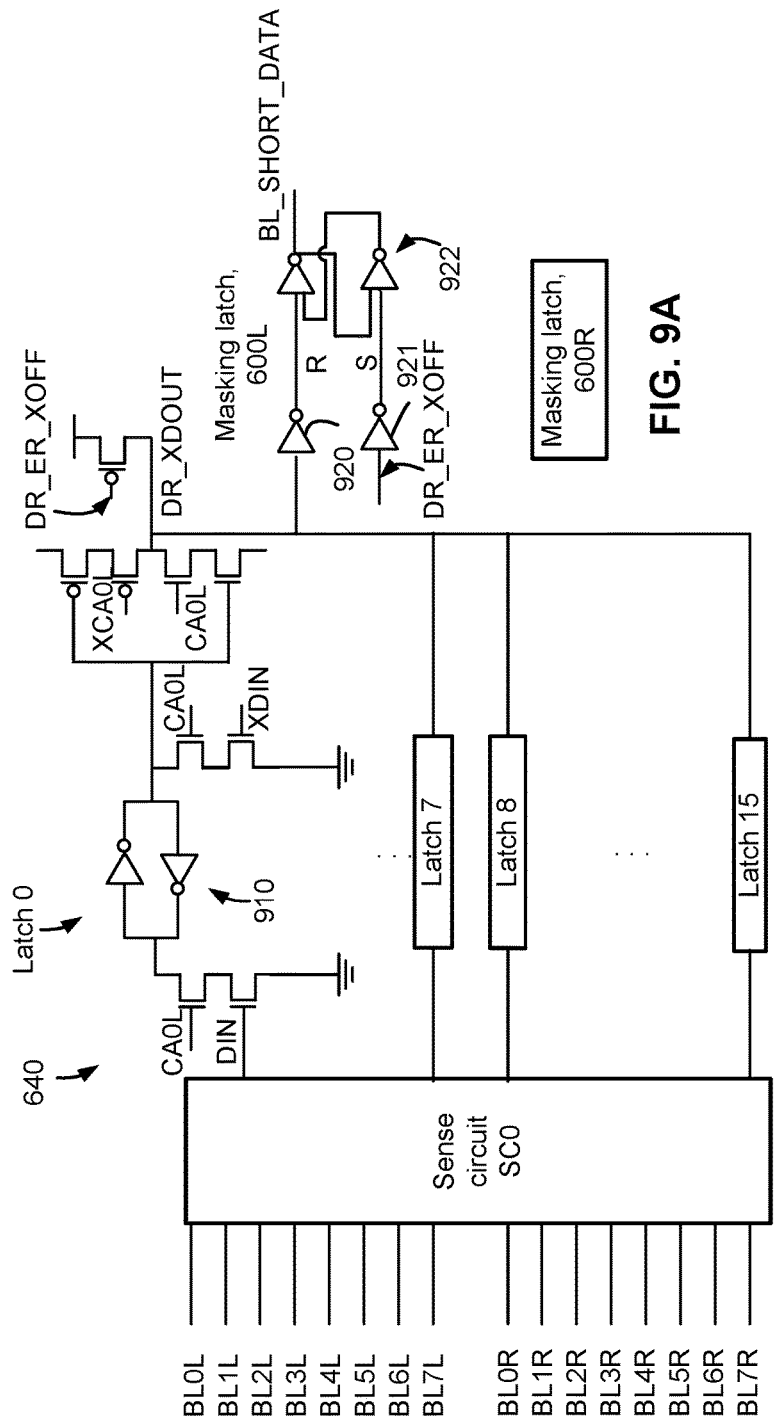
FIG. 9A depicts a circuit comprising the sense circuit SC0, read/write (R/W) data latches 640 and masking latches 600L and 600R of FIG. 6.

FIG. 9A depicts a circuit comprising the sense circuit SC0, R/W data latches 640 and masking latches 600L and 600R of FIG. 6. In this example, there are sixteen bit lines connected to the sense circuit SC0 in two groups: BL0L-BL7L and BL0R-BL7R. There is a R/W latch circuit associated with each bit line. These include latch 0-latch 7 associated with BL0L-BL7L, respectively, and latch 8-latch 15 associated with BL0R-BL7R, respectively. Latch 0 is shown in detail but the other latches can be similar. The latch is connected to SC0 by a path DIN which is the control gate of a transistor. A voltage CA0L (column address of BL0) controls a transistor which connects the DIN transistor to a latch 910 or bistable element comprising two inverters connected back to back. An output of this latch is connected to ground via transistors CA0L and XDIN and to an output DR_XDOUT. At the start of the testing process, a signal DR_ER_XOFF is asserted to set the masking latch 600L. DR_XDOUT and DR_ER_XOFF are provided as inputs to the masking latch, and BL_SHORT_DATA is an output of the masking latch. During sensing, DIN=1 or high indicates the current is high. This indicates a bit line short circuit during testing. This makes DR_XDOUT go low and resets the masking latch so that BL_SHORT_DATA goes low, e.g., to a 0 bit. See FIG. 10.

The masking latch 600L comprises inverters 920 and 921, having an output of ~DR_XDOUT (NOT DR_XDOUT) and ~DR_ER_XOFF (not DR_ER_XOFF). The latch also includes a flip flop circuit 922 of NOR gates having a reset (R) input and a set (S) input. The flip flop circuit is set when the S input (~DR_ER_XOFF) is high or 1 and the R input (~DR_XDOUT) is low or 0, and reset when the S input is low and the R input is high.

The masking latch 600R is associated with the group of bit lines BL0L-BL7L and the group of bit lines BL0R-BL7R during the testing process and with the group of bit lines BL0L-BL7L during the user read/write operations.

Figure 9B:
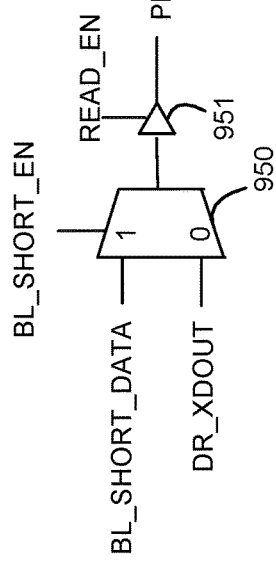
FIG. 9B depicts a multiplexer 950 for providing a data value PR_DATA to a controller based on testing results.

FIG. 9B depicts a multiplexer 950 for providing a data value PR_DATA to a controller. The multiplexer outputs BL_SHORT_DATA or DR_XDOUT based on the selection signal of BL_SHORT_EN. The output is then passed to PR_DATA if an input READ_EN of an amplifier 951 is true. BL_SHORT_EN is a signal set by the controller which indicates that a bit line short circuit testing process is being performed or enabled. BL_SHORT_DATA and DR_XDOUT were discussed above.

Figure 10:
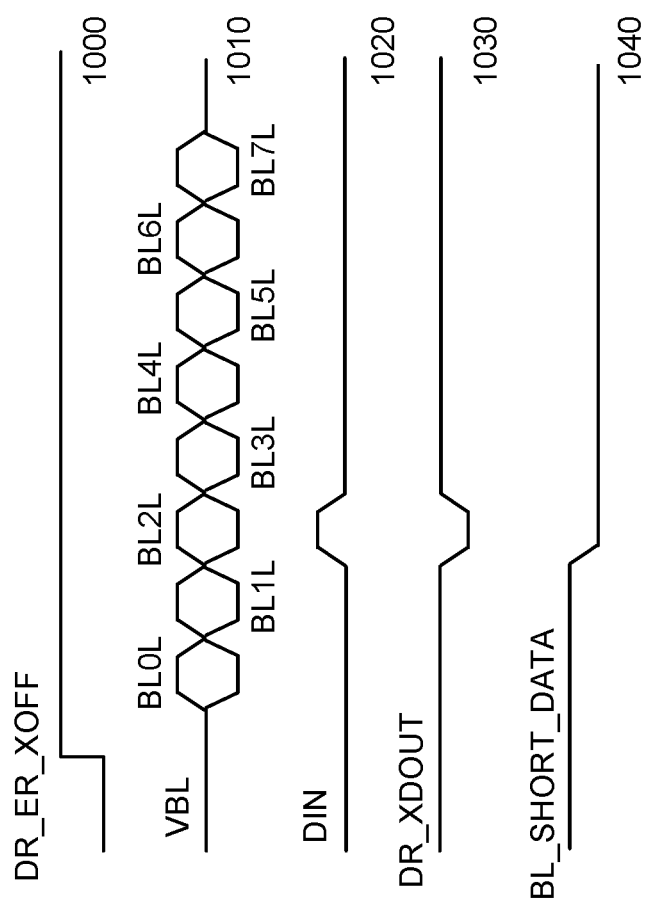
FIG. 10 depicts a timing diagram for testing a group of bit lines.

FIG. 10 depicts a timing diagram for testing a group of bit lines. Refer also to the signals mentioned in FIGS. 9A and 9B. As mentioned, during testing, each bit line in a group is tested for a short circuit. In this example, BL0L-BL7L are tested, one bit line at a time. The waveform 1000 indicates that DR_ER_XOFF increases from low to high to set the masking latch. The waveform 1010 indicates that a bit line voltage (VBL) is applied to each bit line in the group, one bit line at a time. The waveform 1020 indicates that DIN goes high when BL2L is being tested, indicating a high current and a short circuit of that bit line. DIN remains low when the other bit lines are tested, indicating a low current and no short circuit of the other bit lines, in this example. The waveform 1030 indicates that DR_XDOUT goes low when DIN goes high. This value is an input to the masking latch 600L and resets the latch, causing the output of the latch, BL_SHORT_DATA (waveform 1040), to go low (0), indicating a short circuit for the group of bit lines. BL_SHORT_DATA remains low while the remaining bit lines in the group, BL3L-BL7L, are tested. Thus, once any single bit line in a group is found to be bad, BL_SHORT_DATA is set to indicate a short circuit for the group of bit lines.

As mentioned, once the testing of the group of bit lines is completed, BL_SHORT_DATA is reported to the controller as the value PR_DATA. This minimizes the communications to the controller compared to a case where the good or bad status of each bit line is reported to the controller after the testing of each bit line.

Figure 11A:
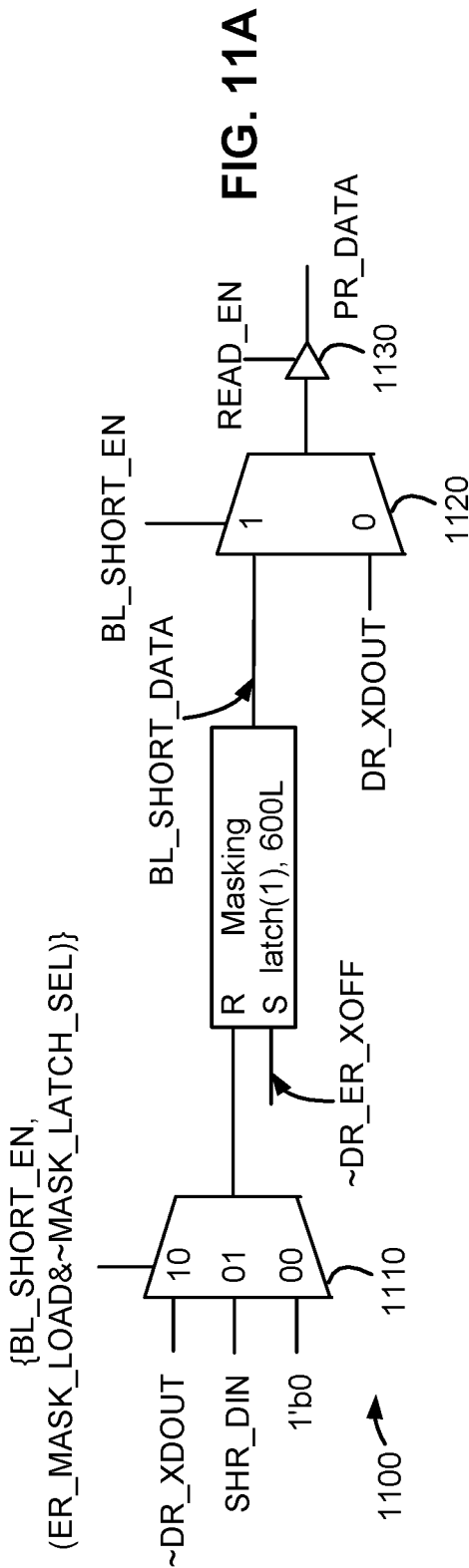
FIG. 11A depicts an example circuit for storing masking data in a latch which is also used for testing.

FIG. 11A depicts an example circuit 1100 for storing masking data in a latch which is also used for testing. In the above example, there are two groups of bit lines connected to a sense circuit and therefore two masking latches. In this case, one masking latch, e.g., latch 600L, can be used for the testing of both groups of bit lines during the testing process. Generally, one masking latch can be used to store a bit which results from testing one or more, or all, groups of bit lines connected to a sense circuit. This masking latch also stores masking data for one group of bit lines during user operations. This masking latch 600L is there reused and serves a double duty. The other masking latch 600R stores masking data for the other group of bit lines during user operations.

The circuit includes a multiplexer 1110 which passes one of ~DR_XDOUT, SHR_DIN and 1'b0 (0 in the Verilog hardware description language) to the reset (R) input of the masking latch 600L based on the selection signal of {BL_SHORT_EN, (ER_MASK_LOAD&~MASK_LATCH_SEL)}. If the bit line testing process is being performed, BL_SHORT_EN is high and ~DR_XDOUT is passed to the output of the multiplexer. ~DR_XDOUT is a high value which resets the masking latch when there is a bit line defect such as a short circuit. The value SHR_DIN is defined as SHR_DIN=PR_DATA&&WE&&BAY_EN. PR_DATA is the output of the multiplexer 950 in FIG. 9B and is the signal provided to the controller. WE is write enable signal that is sent from the controller along with data. BAY_EN is a signal set by the controller which indicates whether the current bay is enabled. ER_MASK_LOAD is a signal which indicates whether the masking data is to be loaded into the masking latches. MASK_LATCH_SEL=0 or 1 if the left or right hand group of bit lines, respectively, is selected. Thus, if the masking data is to be loaded (ER_MASK_LOAD=1) and the left hand group of bit lines is selected (MASK_LATCH_SEL=0), SHR_DIN is passed. See FIG. 12 for further details.

The output of the masking latch 600L, BL_SHORT_DATA is provided to a multiplexer 1120. The multiplexer passes BL_SHORT_DATA or DR_XDOUT to an amplifier 1130 based on the selection signal of BL_SHORT_EN. If the bit line testing process is being performed, BL_SHORT_EN is high and BL_SHORT_DATA is passed. If the bit line testing process is not being performed, BL_SHORT_EN is low and DR_XDOUT is passed. If an enable signal (READ_EN) of an amplifier 1130 is high, the output of the multiplexer 1120 is passed to the controller as PR_DATA.

Figure 11B:
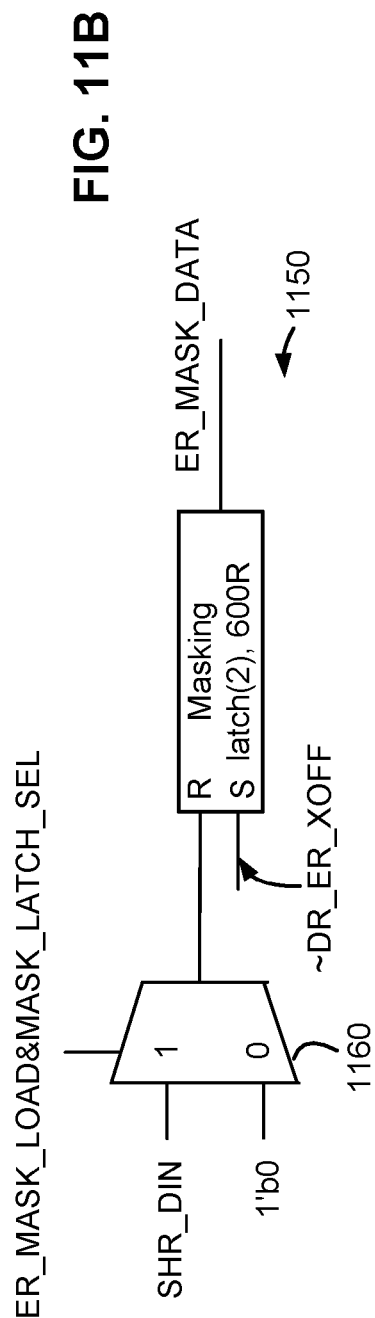
FIG. 11B depicts an example circuit for storing masking data in a latch which is not also used for testing.

FIG. 11B depicts an example circuit 1150 for storing masking data in a latch which is not also used for testing. The masking latch 600R is used for masking an associated group of bit lines when it is a bad group. The circuit includes a multiplexer 1160 which passes one of SHR_DIN and 1'b0 to the reset (R) input of the masking latch 600R based on the selection signal of {ER_MASK_LOAD&MASK_LATCH_SEL}. If the masking latches are being loaded for the right hand group of bit lines, ER_MASK_LOAD=1 and MASK_LATCH_SEL=1, so that SHR_DIN is passed to the reset input of the masking latch. The output of the latch is ER_MASK_DATA and is used to enable or disable an associated group of bit lines.

Figure 12:
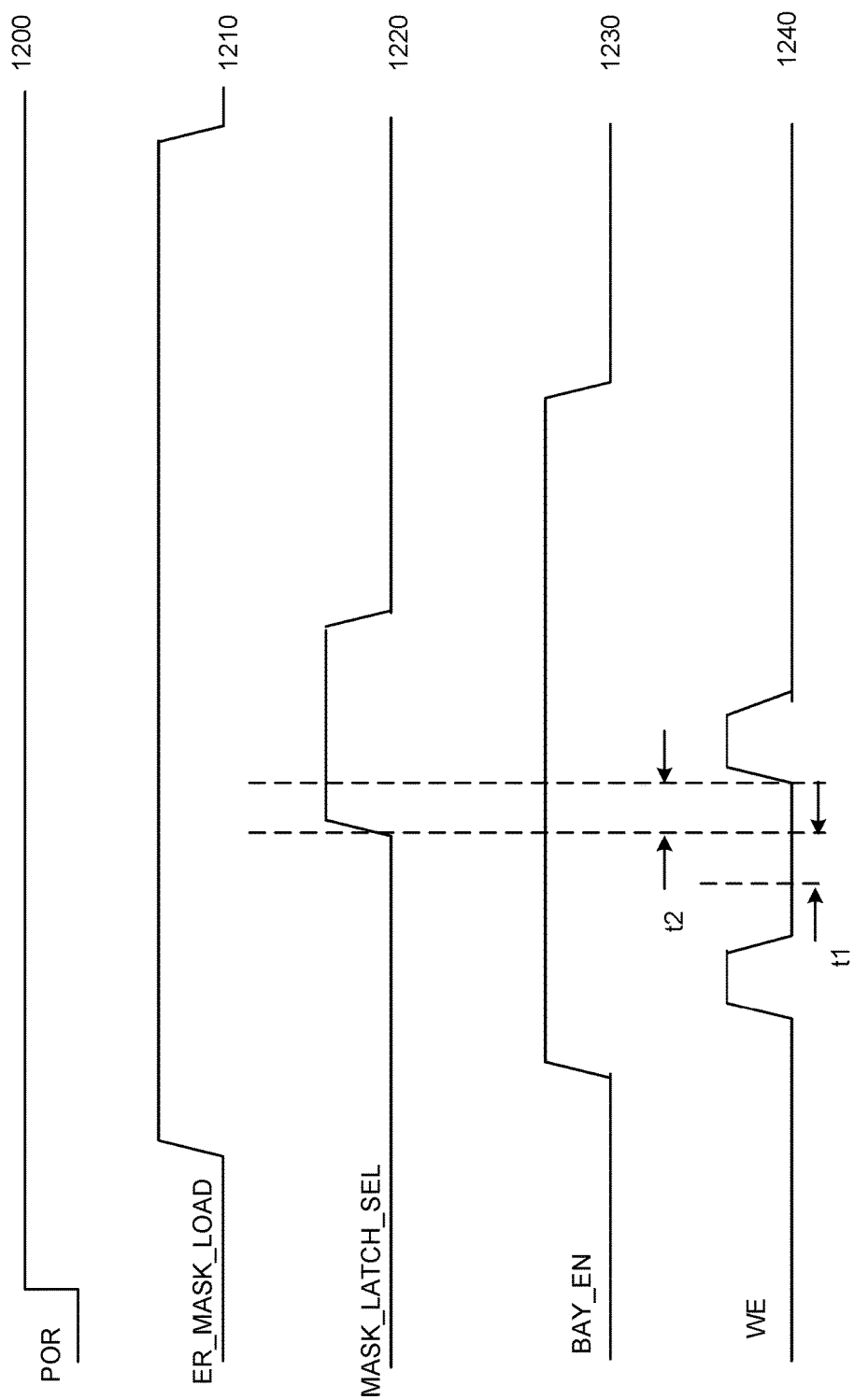
FIG. 12 depicts a timeline of a process for transferring masking data consistent with FIGS. 11A and 11B.

FIG. 12 depicts a timeline of a process for transferring masking data consistent with FIGS. 11A and 11B. The waveform 1200 indicates when a power on reset occurs (POR goes high). The waveform 1210 indicates when the loading of the masking data in the masking latches begins, when ER_MASK_LOAD goes high. The waveform 1220 indicates when MASK_LATCH_SEL goes high. When MASK_LATCH_SEL=0, masking data for the left group of bit lines is stored into masking latch 600L. When MASK_LATCH_SEL=1, masking data for the right group of bit lines is stored into masking latch 600R. The waveform 1230 denotes BAY_EN which indicates when a particular BAY gets selected or enabled to load the masking data. The waveform 1240 denotes WE which indicates when a write enable pulse is sent along with data from the controller. The time periods t1 and t2 are used by the column redundancy circuit to calculate the masking data and put it onto the bus 650 so that the page registers can receive it along with the WE pulse.

FIG. 13A depicts an example circuit 1300 for enabling or disabling a group of bit lines based on the latches of FIGS. 11A and 11B. A multiplexer 1310 passes the masking data of the masking latch 600R or 600L to an AND unit 1320 based on MASK_LATCH_SEL. A sense amplifier enable (SAE) signal is also provided to the AND unit. If the masking data=1, the group of bit lines is good and with, SAE=1, PR_SA_ENABLE=1, and the group of bit lines is enabled. If the masking data=0, the group of bit lines is bad, PR_SA_ENABLE=0, and the group of bit lines is disabled.

For a read operation, SAE=1. For a write operation which is a set operation for a resistance-switching memory cell, SAE=1 if the cell is in the reset state or 0 if the cell is already in the set state. For a write operation which is a reset operation for a resistance-switching memory cell, SAE=1 if the cell is in the set state or 0 if the cell is already in the reset state.

FIG. 13B depicts an example circuit for supplying a voltage to a bit line, consistent with FIG. 13A. The circuit 1350 may be provided for each of the bit lines and in each sense circuit, such as SC0-SC4 in FIG. 6. The circuit provides a supply voltage Vdd at a node 1351. A pMOS transistor 1352 receives a signal IREF_EN. An output of this transistor is provided on a sense node 1358 as Vsense. An nMOS transistor 1353 receives a signal SFG. The transistor acts as a source-follower so that a read voltage Vrd is supplied through this transistor based on Vrd=Vsfg−Vth of the transistor. SA_OUT is an output at a node 1354 which is connected to the bit line. An nMOS transistor 1355 receives the signal ~PR_SA_ENABLE and a pMOS transistor 1356 receives the signal PR_SA_ENABLE. A voltage Vub at a node 1357 is connected to these two transistors.

When PR_SA_ENABLE=1, (bit line is enabled) the transistors 1355 and 1356 are non-conductive. The voltage Vrd and the reference current Iref_en are passed to the bit line. When PR_SA_ENABLE=0, (bit line is disabled) the transistors 1355 and 1356 are conductive and Vub is passed to the bit line. These transistors are used in a pass transistor configuration so that Vub is passed to the bit line. The transistor 1352 should be made non-conductive when the bit line is disabled to avoid interfering with the driving of the bit line by Vub. The voltage at the sense node is used during a sensing operation to detect whether the memory cell connected to the bit line is in a conductive or non-conductive state. In one embodiment, an apparatus comprises a plurality of sense circuits, each sense circuit connected to a group of bit lines; a column redundancy circuit storing a bit for each group of bit lines indicating whether the group of bit lines comprises a defect; and a page register comprising a latch associated with each group of bit lines, the page register configured to load the bits into the latches from the column redundancy circuit in response to a power on reset, each bit indicates whether the associated group of bit lines is enabled or disabled.

In another embodiment, a method includes testing each bit line of group of bit lines connected to a sense circuit, one bit line at a time; storing a bit indicating a result of testing of the group of bit lines; communicating the bit to a controller after completing the testing is completed; and storing the bit in a column redundancy circuit.

In another embodiment, an apparatus comprises: latches associated with groups of bit lines, the groups of bit lines are connected to a set of memory cells; means for transmitting data to the latches in response to a power on reset; and means for enabling or disabling associated groups of bit lines based on the data in the latches.

In various embodiments, the means for transmitting data can include the controller 622, column redundancy circuit 620 and bus 650 of FIG. 6, the multiplexer 1110 of FIG. 11A, the multiplexer 1160 of FIG. 11B, or other logic hardware, and/or other executable code stored on a computer readable storage medium. Other embodiments may include similar or equivalent means for transmitting data. The means for enabling or disabling associated groups of bit lines can include the controller 622, column redundancy circuit 620, bus 650, and the masking latches 600L-604L and 600R-604R of FIG. 6, the multiplexer 1120 of FIG. 11A, or other logic hardware, and/or other executable code stored on a computer readable storage medium. Other embodiments may include similar or equivalent means for transmitting data.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
    a sense circuit connected to a set of bit lines, the set of bit lines comprises a first group of bit lines and a second group of bit lines, the sense circuit configured to sense one bit line at a time in the set of bit lines; a column redundancy circuit storing a first bit for the first group of bit lines indicating whether the first group of bit lines comprises a defect and a second bit for the second group of bit lines indicating whether the second group of bit lines comprises a defect; and
    a page register comprising a first latch for the first group of bit lines and a second latch for the second group of bit lines, the page register configured to load the first bit into the first latch and to load the second bit into the second latch from the column redundancy circuit in response to a power on reset, the first bit indicates whether the first group of bit lines is enabled or disabled, and the second bit indicates whether the second group of bit lines is enabled or disabled.

2. The apparatus of claim 1, wherein:
    the bits remain in the latches until a subsequent power on reset.

3. The apparatus of claim 1, further comprising:
    a circuit associated with each group of bit lines, the circuit configured to enable or disable use of the first and second groups of bit lines based on the first and second bits in the first and second latches, respectively, by allowing or preventing, respectively, applying of voltages to the first and second groups of bit lines, respectively.

4. The apparatus of claim 3, wherein:
the circuit is configured to enable or disable use of the first and second groups of bit lines based on the first and second bits in the first and second latches, respectively, during multiple read or write operations without reloading the first and second bits into the first and second latches, respectively.

5. The apparatus of claim 1, wherein the sense circuit, the column redundancy circuit and the page register are on a memory chip, the apparatus further comprising:
an off-chip controller configured to communicate write data to the first and second latches without communicating data for enabling or disabling the groups of bit lines groups.

6. The apparatus of claim 1, wherein:
the first group of bit lines is on a left hand side of the sense circuit; and
the second group of bit lines is on a right hand side of the sense circuit.

7. The apparatus of claim 1, wherein:
the first group of bit lines has a comb layout which intermeshes with a comb layout of the second group of bit lines.

8. The apparatus of claim 1, further comprising:
a first multiplexer connected to an input of the first latch;
the first multiplexer is configured to pass the first bit and the second bit to the first latch when a testing process for a bit line short circuit is set; and
the first multiplexer is configured to pass the first bit to the first latch from the column redundancy circuit when the testing process for a bit line short circuit is not set; and
a second multiplexer connected to an input of the second latch, the second multiplexer is configured to pass the second bit to the second latch from the column redundancy circuit when the testing process for the bit line short circuit is not set.

9. The apparatus of claim 1, further comprising:
an AND unit; and
a multiplexer comprising inputs connected to an output of the first latch and to an output of the second latch, the multiplexer configured to pass the first bit or the second bit to a first input of the AND unit, based on a selection signal of the multiplexer.

10. The apparatus of claim 9, further comprising:
circuitry configured to supply a voltage to each bit line, the AND unit comprising a second input connected to an enable signal for the circuitry and an output connected to the circuitry.

11. The apparatus of claim 10, wherein for each bit line:
the enable signal is high during a set operation for a resistance-switching memory cell which is in a reset state;
the enable signal is low during the set operation for a resistance-switching memory cell which is in a set state;
the enable signal is high during a reset operation for a resistance-switching memory cell which is in a set state; and
the enable signal is low during the reset operation for a resistance-switching memory cell which is in the reset state.

12. The apparatus of claim 1, wherein:
the first group of bit lines is adjacent to the second group of bit lines.

* * * * *